US012635537B2

(12) United States Patent
Lin et al.

(10) Patent No.: US 12,635,537 B2
(45) Date of Patent: May 19, 2026

(54) INTERCONNECTION STRUCTURE FOR MULTI-CHIP INTERPOSER AND METHOD OF MANUFACTURING SAME

(71) Applicant: TAIWAN SEMICONDUCTOR MANUFACTURING COMPANY, LTD., Hsinchu (TW)

(72) Inventors: Chou-Kun Lin, Hsinchu (TW); Harsha Vardhan Penugonda, Hsinchu (TW); Monsen Liu, Hsinchu (TW); King-Ho Tam, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 223 days.

(21) Appl. No.: 18/592,911

(22) Filed: Mar. 1, 2024

(65) Prior Publication Data

US 2025/0087589 A1      Mar. 13, 2025

Related U.S. Application Data

(60) Provisional application No. 63/582,044, filed on Sep. 12, 2023.

(51) Int. Cl.
H10W 70/60          (2026.01)
H10W 70/05          (2026.01)
(Continued)

(52) U.S. Cl.
CPC .......... *H10W 70/611* (2026.01); *H10W 70/05* (2026.01); *H10W 70/093* (2026.01);
(Continued)

(58) Field of Classification Search
CPC ............ H01L 21/4853; H01L 23/5383; H01L 23/5384; H01L 23/5386; H01L 21/4857;
(Continued)

(56) References Cited

U.S. PATENT DOCUMENTS

2021/0280491 A1      9/2021  Lin et al.
2022/0020700 A1      1/2022  Yeh et al.
(Continued)

FOREIGN PATENT DOCUMENTS

JP            2014-236187          12/2014
KR      10-2016-0034184            3/2016
(Continued)

*Primary Examiner* — Timothy J Thompson
*Assistant Examiner* — Michael F Mcallister
(74) *Attorney, Agent, or Firm* — Hauptman Ham, LLP

(57)          ABSTRACT

An interconnection structure (for a multi-chip interposer) includes: a first via stack at a first one amongst locations, the locations correspondingly being defined relative to first and second perpendicular directions, the via stack including vias stacked over each other in a third direction perpendicular to each of the first and second directions; a transition segment in a transition layer and overlapping and coupled to an uppermost one of the vias in the via stack at the first location, the transition segment being conductive and extending in at least the first direction or the second direction to overlap a second one of locations offset from the first location; and a first contact bump at the second location and over and coupled to the via stack.

20 Claims, 18 Drawing Sheets

(51) Int. Cl.
 H10W 70/65    (2026.01)
 H10W 70/685   (2026.01)
 H10W 90/00    (2026.01)

(52) U.S. Cl.
 CPC ......... H10W 70/65 (2026.01); H10W 70/685
     (2026.01); H10W 90/701 (2026.01)

(58) Field of Classification Search
 CPC ............. H01L 21/486; H01L 23/49811; H01L
    23/49816; H01L 23/49827; H01L
    23/49838; H01L 23/50; H01L 23/5226;
    H01L 23/5283; H01L 23/5385; H01L
    24/16; H01L 25/0655; H01L 2224/1616;
    H01L 2225/06513; H10B 80/00
 See application file for complete search history.

(56)      References Cited

U.S. PATENT DOCUMENTS

| | | | |
|---|---|---|---|
| 2022/0285295 A1 | 9/2022 | Chiang et al. | |
| 2023/0154912 A1 | 5/2023 | Chern et al. | |

FOREIGN PATENT DOCUMENTS

| | | |
|---|---|---|
| TW | 201810584 | 3/2018 |
| TW | 201903979 | 1/2019 |
| TW | 202131458 | 8/2021 |
| TW | 202220148 | 5/2022 |
| TW | 202230710 | 8/2022 |
| TW | 202310277 | 3/2023 | row(XY)

row(XY)

row(XY)

row(XY)

102(5)E

102(5)

102(5)

102(5)E row row row row

Y-axis

X-axis

Z-axis

402
Generate layout diagram

404
Manufacture semiconductor device
based on layout diagram

400

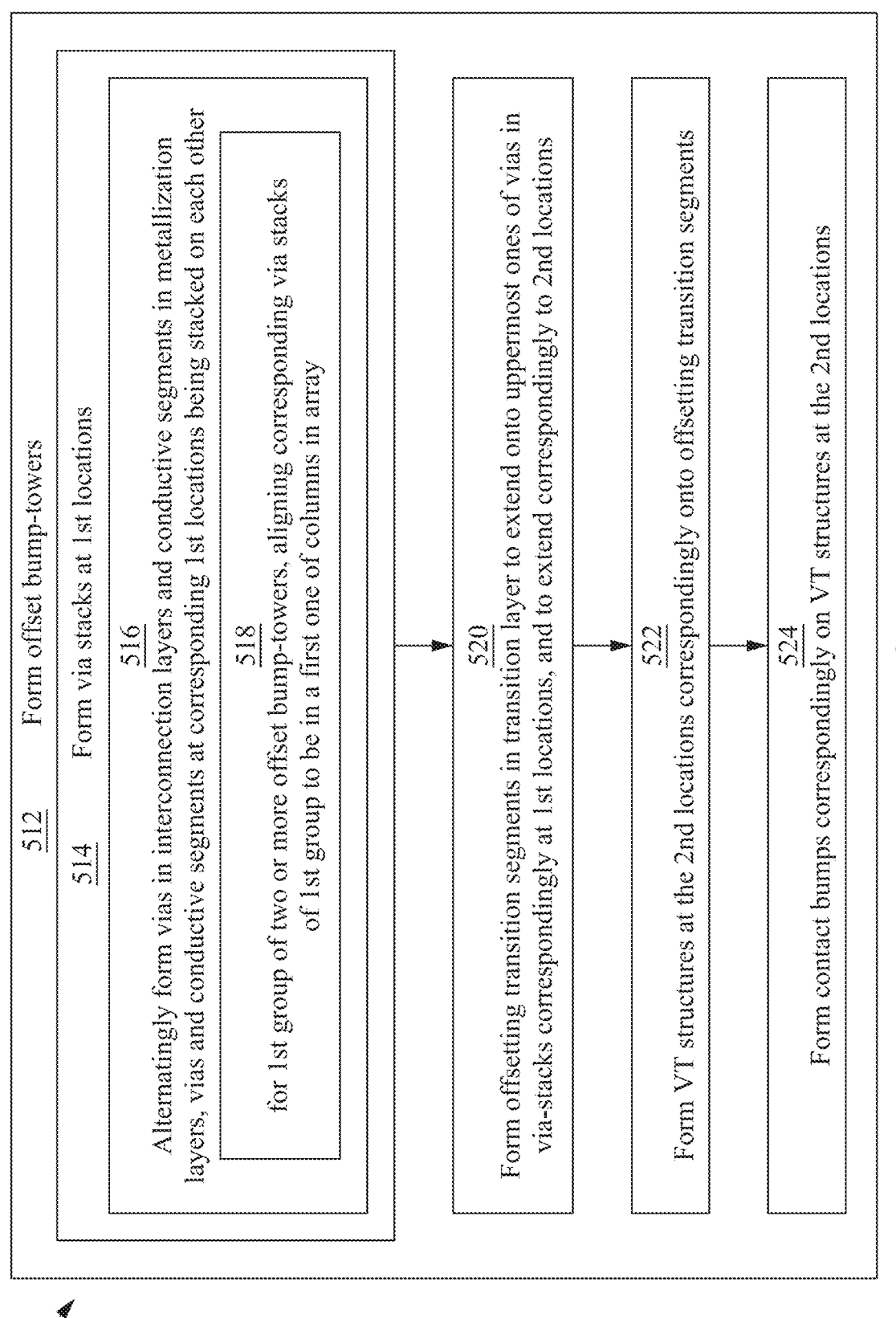

512 Form offset bump-towers

514 Form via stacks at 1st locations

516

Alternatingly form vias in interconnection layers and conductive segments in metallization layers, vias and conductive segments at corresponding 1st locations being stacked on each other

518 for 1st group of two or more offset bump-towers, aligning corresponding via stacks of 1st group to be in a first one of columns in array

520

Form offsetting transition segments in transition layer to extend onto uppermost ones of vias in via-stacks correspondingly at 1st locations, and to extend correspondingly to 2nd locations

522

Form VT structures at the 2nd locations correspondingly onto offsetting transition segments

524

Form contact bumps correspondingly on VT structures at the 2nd locations

INTERCONNECTION STRUCTURE FOR MULTI-CHIP INTERPOSER AND METHOD OF MANUFACTURING SAME

PRIORITY

The present application claims the priority of U.S. Provisional Application No. 63/582,044, filed Sep. 12, 2023, which is incorporated herein by reference in its entirety.

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 4 and 5 are flowcharts of corresponding methods of manufacturing an interconnection structure, in accordance with some embodiments.

DETAILED DESCRIPTION

Figure 1A:
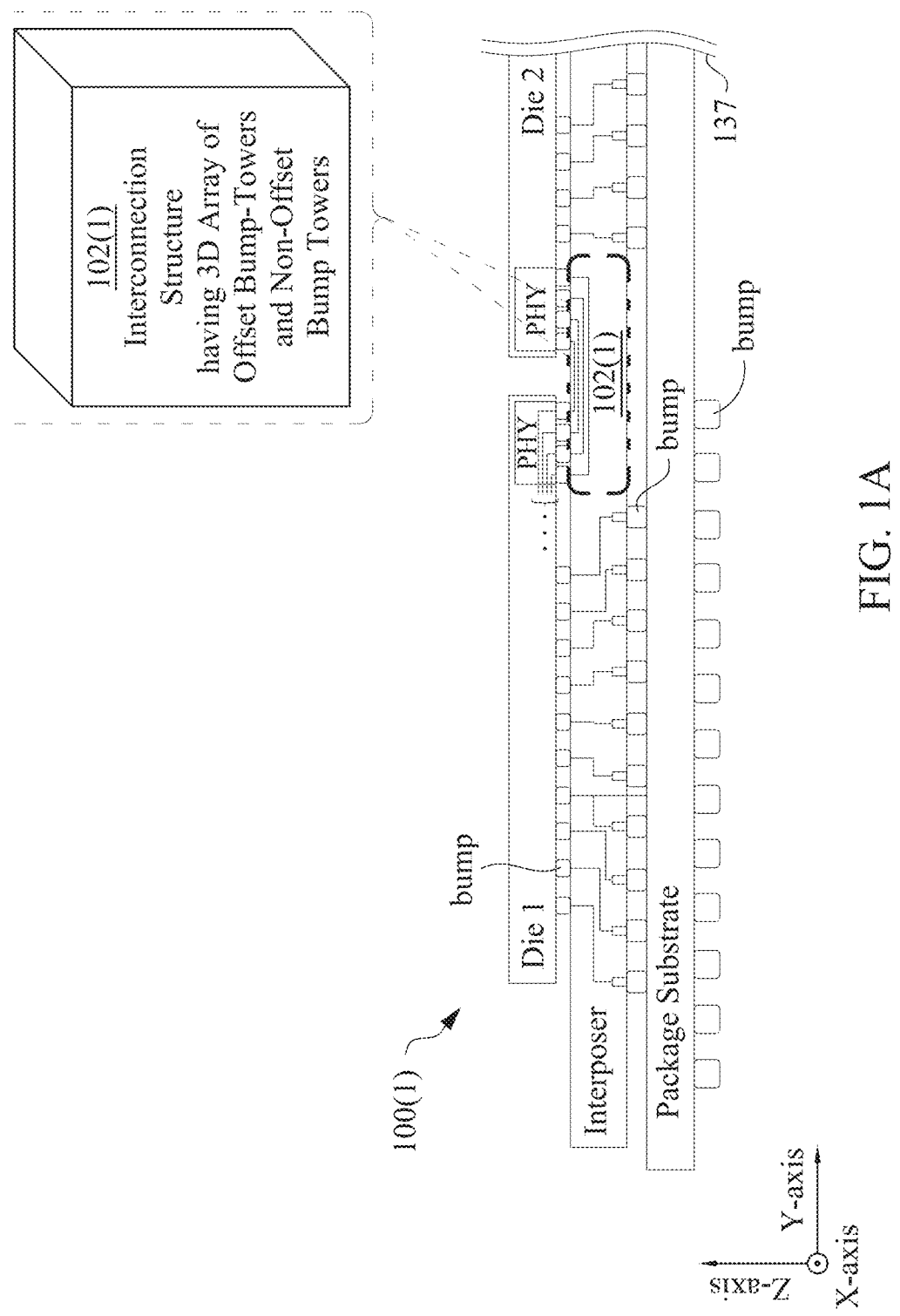
FIGS. 1A-1B are sectional views of corresponding multi-chip systems, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, an interconnection structure (for a multi-chip interposer) includes offset bump-towers each including: a via stack at corresponding first one amongst locations, the locations correspondingly being defined relative to first and second perpendicular directions, the via stack including vias stacked over each other in a third direction perpendicular to each of the first and second directions; a transition segment in a transition layer and overlapping and coupled to an uppermost one of the vias in the via stack at the first location, the transition segment being conductive and extending in at least the first direction or the second direction to overlap a second one of locations offset from the first location; and a contact bump at a corresponding second one of the locations that are offset from the first location in at least the first direction or the second direction, the contact bump being coupled to the transition segment.

In some embodiments, the interconnection structure is for a multi-chip interposer that is compatible with a High Bandwidth Interconnect (HBI) standard. In some embodiments, the interconnection structure is for a multi-chip interposer that is compatible with a high bandwidth memory (HBM) standard.

In some embodiments, the interconnection structure is arranged as an array that is organized to include columns, rows and slices. The interconnection structure includes non-offset bump-towers as well as offset bump-towers. The use of offset bump-towers as well as non-offset bump towers results in line segments (e.g., 216 of FIGS. 2A and 2C-2D) that are substantially straight.

Another approach provides for an interconnection structure that is compatible with a given HBM standard. Among other things, the interconnection structure according to the other approach has line counterparts to the substantially straight line segments of present embodiments. According to the other approach, only non-offset bump-towers are used. Consequently, the line counterparts according to the other approach are piecewise-continuous lines that are formed of short sections which intersect each other at about a 45 degree angle resulting in staggered or wavy line counterpart which increases the lengths of the line counterparts and decreases routability. By contrast, the use of offset bump-towers according to some embodiments facilitates the instances of the line segments being substantially straight, which reduces the length of the instances of the line segments, and increases the routability of the interconnection structure as compared to the other approach.

FIG. 1A is sectional view of a multi-chip system 100(1) in accordance with some embodiments.

Multi-chip system 100(1) includes multiple chips (or dies), namely die 1 and die 2 that are disposed on a multi-chip interposer. Multi-chip system 100(1) facilitates high bandwidth communication between die 1 and die 2. The interposer is disposed on a package substrate. Variously sized contact bumps are formed as follows: between the interposer and correspondingly each of die 1 and die 2; between the interposer and a first side of the package substrate; and on a second side of the package substrate opposite to the first side, i.e., to the interposer. Through the contact bumps on the second side of the package substrate, multi-chip system 100(1) communicates with external devices (not shown). For simplicity of illustration, FIG. 1A includes a break line 137 indicating that a portion of multi-chip system 100(1) is shown in FIG. 1A.

Through first and second wiring arrangements in the interposer, wiring (not shown) arrangements in the package substrate, and corresponding ones of the contact bumps, at least one of die 1 and die 2 correspondingly communicates with the package substrate. Through a third wiring arrangement in the interposer and corresponding ones of the contact bumps, die 1 and die 2 also communicate with each other. More particularly, the third wiring arrangement includes an interconnection structure 102(1) (see FIGS. 2A-2D, 3A-3E, or the like). In FIG. 1A, interconnection structure 102(1) is shown in an exploded view.

Regarding FIG. 1A, in some embodiments, the third wiring arrangement at least partially represent a physical layer PHY, e.g., a physical connection PHY, as defined by a High Bandwidth Interconnect (HBI) standard, e.g., an HBI standard promulgated by the Joint Electron Device Engineering Council (JEDEC) Solid State Technology Association (SSTA), or the like. In some embodiments, the third wiring arrangement at least partially represent a physical interface PHY, e.g., low-level PHY, as defined by an HBI standard, e.g., an HBI standard promulgated by the JEDEC SSTA, or the like. In some embodiments, the third wiring arrangement at least partially represent a physical connection interface PHY, e.g., low-level PHY, as defined by an HBI standard, e.g., an HBI standard promulgated by the JEDEC SSTA, or the like. In some embodiments, the HBI standard adopts the PHY as defined by a High Bandwidth Memory (HBM) standard (see FIG. 1B), e.g., an HBM standard promulgated by the JEDEC SSTA, or the like.

Figure 1B:
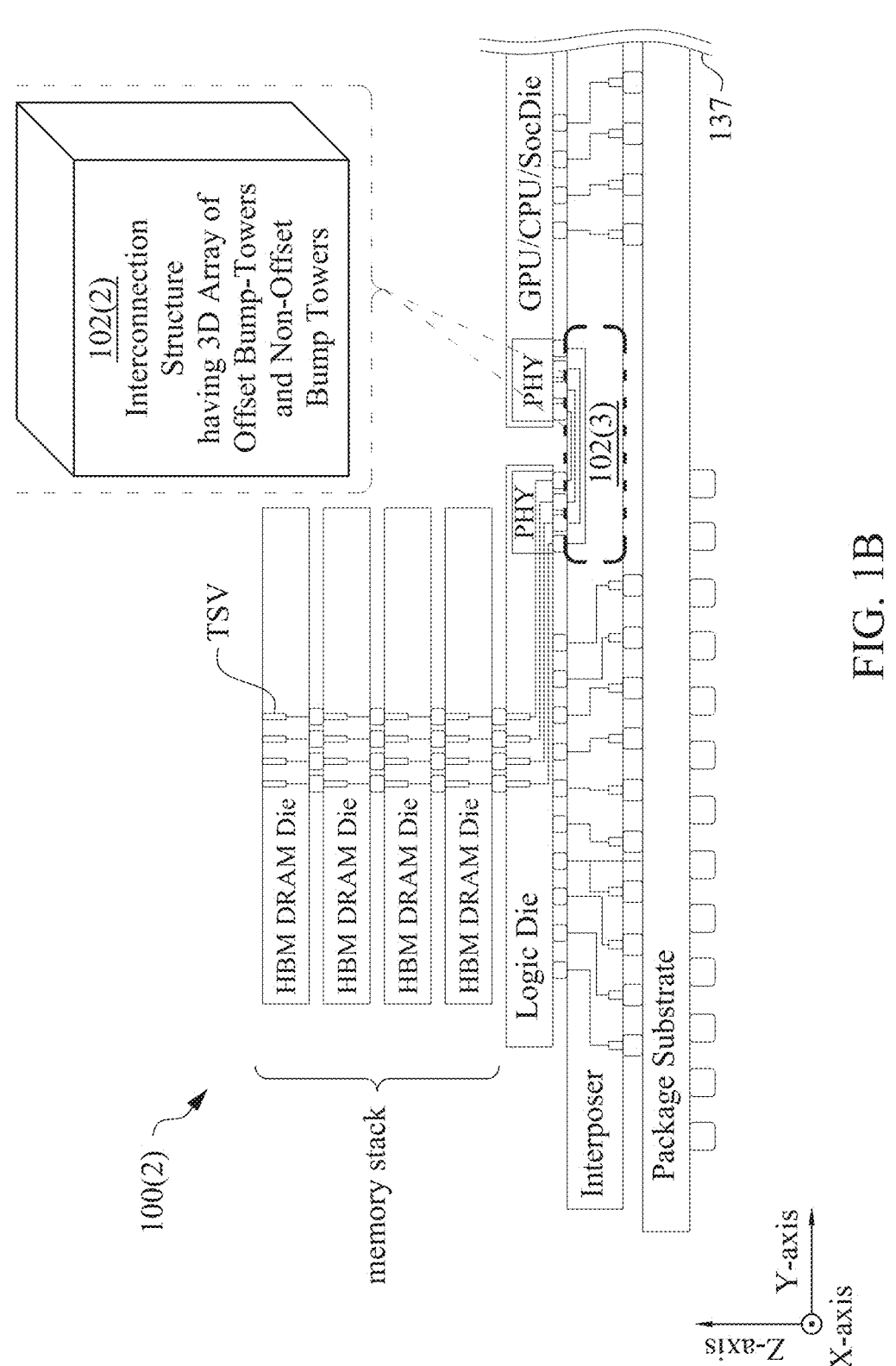

FIG. 1B is a multi-chip system 100(2) in accordance with some embodiments.

Multi-chip system 100(2) of FIG. 1B is similar to multi-chip system 100(1) of FIG. 1A. For brevity, the discussion will focus on differences of system 100(2) as compared to system 100(1) rather than on similarities.

In multi-chip system 100(2), die 1 and die 2 are more specific devices as compared to FIG. 1A. Die 1 is a logic die. Die 2 is a general processing unit (GPU) die, a central processing unit (CPU), a system on chip (SOC), or the like. The third wiring arrangement of the interposer includes interconnection structure 102(2). In FIG. 1B, interconnection structure 102(2) is shown in an exploded view. In some embodiments, interconnection structure 102(2) is the same as interconnection structure 102(1).

Multi-chip system 100(1) further includes a memory stack disposed on the logic die.

The memory stack includes memory dies, e.g., HBM dynamic random access memory (DRAM) dies, stacked on each other.

Variously sized contact bumps are formed as follows: between the logic die and a lowermost one of the memory dies; and between adjacent ones of the memory dies. Through a fourth wiring arrangement of corresponding ones of the contact bumps, the memory dies of the memory stack communicate with the third wiring arrangement (including interconnection structure 102(2)), and thereby with die 2.

Regarding FIG. 1B, in some embodiments, the third wiring arrangement at least partially represent a physical layer PHY, e.g., a physical connection PHY, as defined by a High Bandwidth Memory (HBM) standard, e.g., an HBM standard promulgated by the JEDEC SSTA, or the like. In some embodiments, the third wiring arrangement at least partially represent a physical interface PHY, e.g., low-level PHY, as defined by an HBM standard, e.g., an HBM standard promulgated by the JEDEC SSTA, or the like. In some embodiments, the third wiring arrangement at least partially represent a physical connection interface PHY, e.g., low-level PHY, as defined by an HBM standard, e.g., an HBM standard promulgated by the JEDEC SSTA, or the like.

FIGS. 1C-1H are corresponding simplistic three-quarter perspective views 102(5)C, 102(5)E and 102(5)G that together represent an interconnection structure 102(5), in accordance with some embodiments.

Figure 1D:
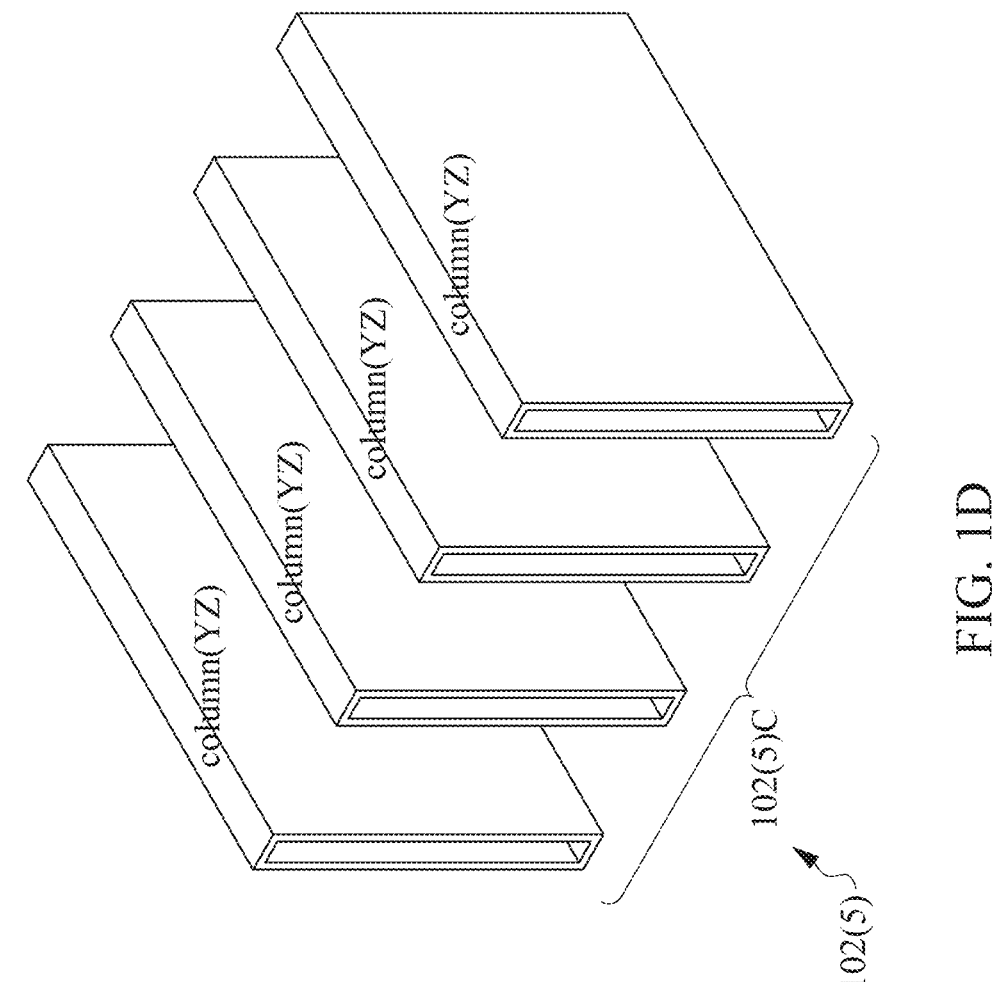
FIGS. 1C-1H are corresponding simplistic three-quarter perspective views that together represent an interconnection structure, in accordance with some embodiments.
Figure 1C:
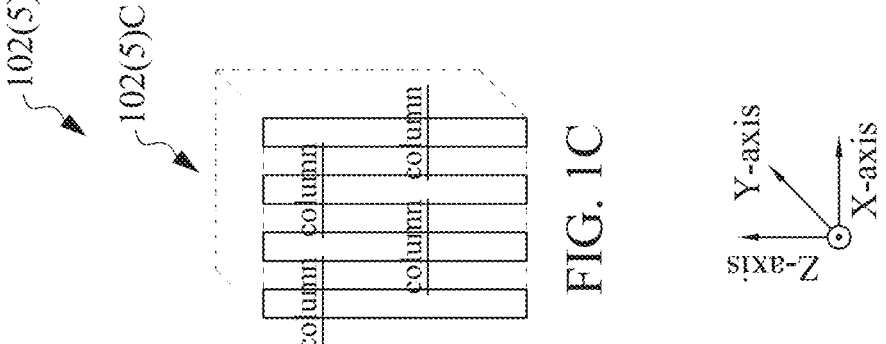
Figure 1F:
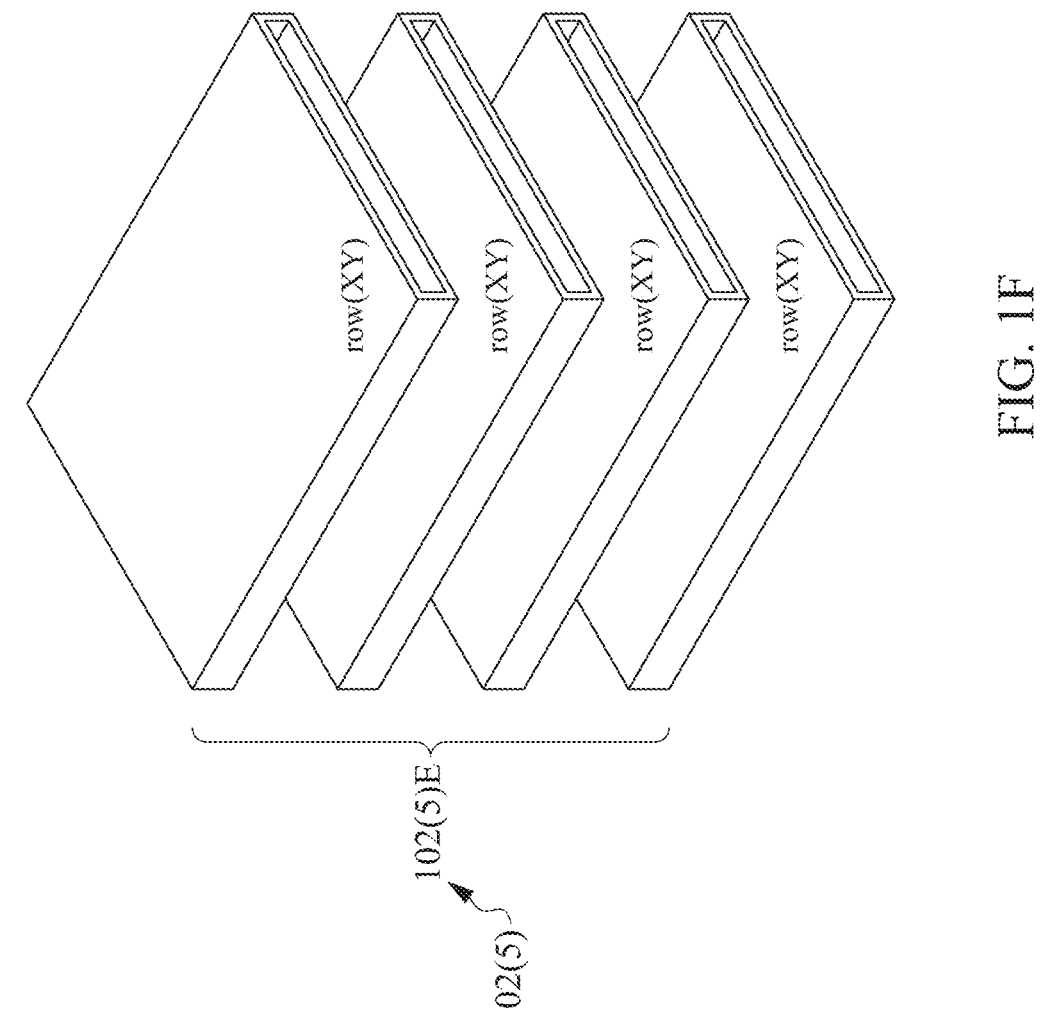
Figure 1E:
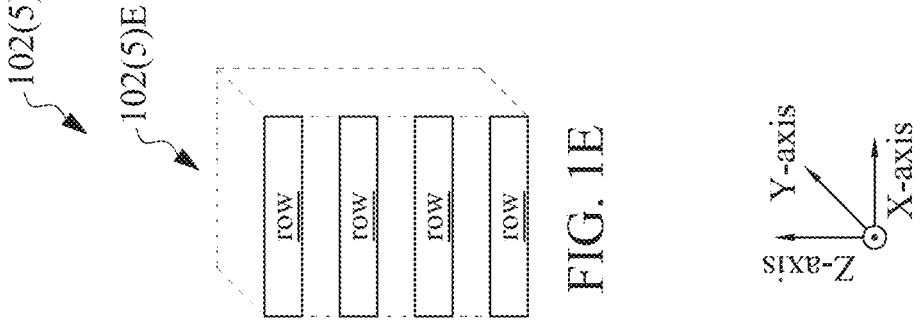
Figure 1H:
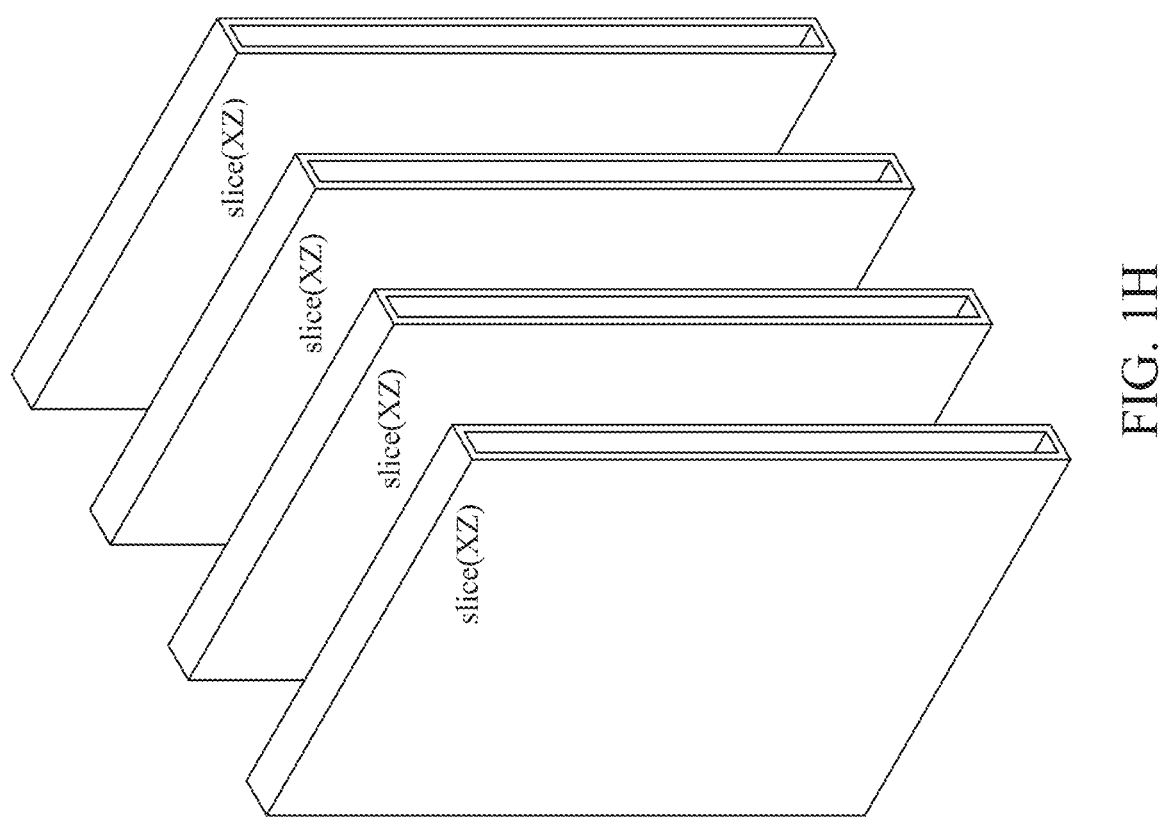
Figure 1G:
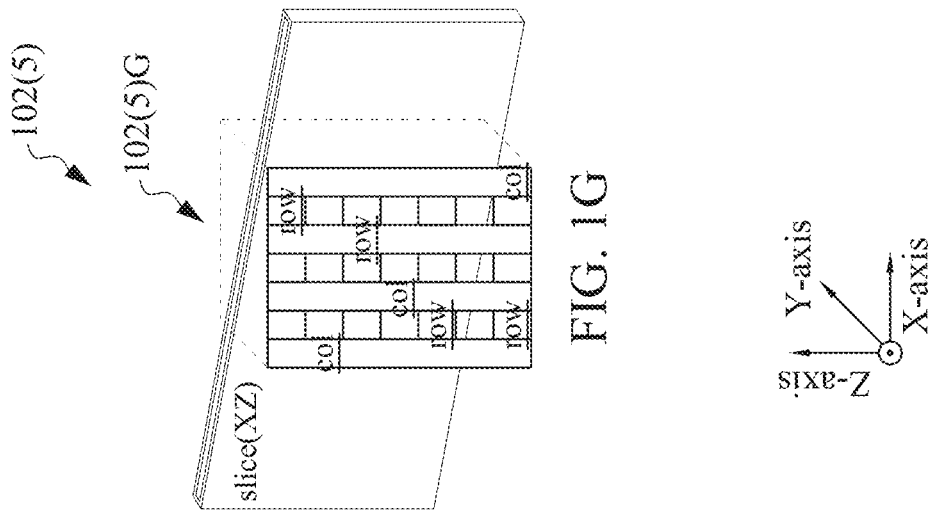

FIGS. 1D, 1F and 1H are more detailed versions of corresponding FIGS. 1C, 1E and 1G. Interconnection structure 102(5) is an example of interconnection structure 102(1) or 102(2), or the like. Similarly, FIGS. 2A-2D and 3A-3E are correspondingly examples of interconnection structure 102(1) or 102(2), or the like. Among other reasons, FIGS. 1C-1H are provided to help relate the orientations correspondingly of FIGS. 2A-2D and 3A-3E to FIGS. 1A-1B, or the like.

Interconnection structure 102(5) is a three-dimensional array organized into columns, rows and slices. View 102(5)C of FIGS. 1C-1D shows how columns are arranged in interconnection structure 102(5). Each of the columns extends in the directions of the Y-axis and the Z-axis. Accordingly, each of the columns in FIG. 1D is labeled column (YZ).

View 102(5)E of FIGS. 1E-1F shows how rows are arranged in interconnection structure 102(5). Each of the rows extends in the directions of the X-axis and the Y-axis. Accordingly, each of the rows in FIG. 1F is labeled row (XY).

View 102(5)G of FIGS. 1G-1H shows how slices are arranged in interconnection structure 102(5). Each of the slices extends in the directions of the X-axis and the Z-axis. Accordingly, each of the slices in FIG. 1H is labeled slice (XZ).

Figure 2A:
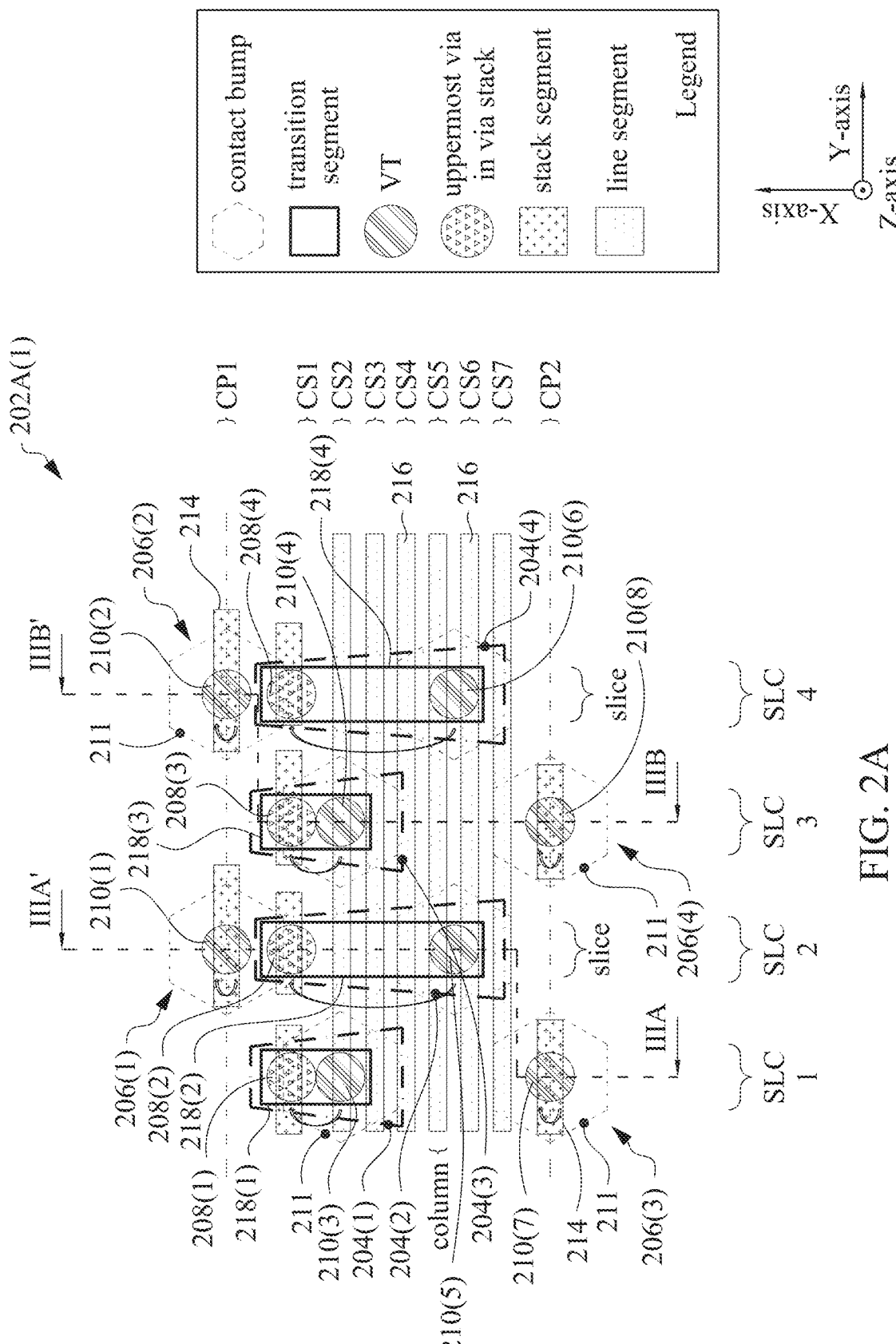
FIGS. 2A-2D are layout diagrams of corresponding interconnection structures, in accordance with some embodiments.

FIG. 2A is a layout diagram of an interconnection structure 202A(1), in accordance with some embodiments.

The layout diagram of FIG. 2A is representative of a portion of device, e.g., a semiconductor device. Structures in the device are represented by patterns (also known as shapes) in the layout diagram. For simplicity of discussion, elements in the layout diagram of FIG. 2A (and also in other layout diagrams disclosed herein) will be referred to as if they are structures rather than patterns per se. For example, instances of pattern 214 in FIG. 2A represent instances of routing segment in a corresponding layer of metallization. In the following discussion, instances of element 214 are referred to as instances of stack segments 214 rather than as instances of a stack segment pattern 214.

In FIG. 2A, as well as in other layout diagrams disclosed herein, an orthogonal Cartesian coordinate system is assumed in which a first direction is parallel to the X-axis, a second direction is parallel to the Y-axis and a third direction is parallel to the Z-axis. A layout diagram per se is a top view. Shapes in the layout diagram are two-dimensional relative to, e.g., the X-axis and the Y-axis, whereas the device being represented is three-dimensional. In some embodiments, the first to third directions correspond to directions other than the X-axis, Y-axis and Z-axis.

Typically, relative to the Z-axis, the device is organized as a stack of layers in which are located corresponding structures, i.e., to which belong corresponding structures. More particularly, each shape in the layout diagram represents a component in a corresponding layer of the corresponding device. Also, typically, the layout diagram represents relative depth, i.e., positions along the Z-axis, of shapes and corresponding layers by superimposing a second shape on a first shape so that the second shape at least partially overlaps the first shape. Some structures are stacked in a layout diagram along the Z-axis; however, the stacking order along the Z-axis is distorted in some respects relative to the corresponding device for simplicity of illustration. For example, in FIGS. 2A-2D, stack segments 214 are shown over corresponding vias, e.g., via 208(1), or VT structures, e.g., VT structure 210(7).

In FIG. 2A, each of section line IIIA-IIIA' and section line IIIB-IIIB' is an offset sectional line in which the cutting plane for the offset section is stepped or offset at one or more right angle bends. In some embodiments, the cutting plane that produces an offset section is referred to as a piecewise-continuous cutting plane. Section line IIIA-IIIA' corresponds to cross-sectional view 330A of FIG. 3A. Section line IIIB-IIIB' corresponds to the cross-sectional view 330B of FIG. 3B.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. Alternatively, and/or additionally, in some circumstances, not all elements of a given depicted layer of the corresponding semiconductor device are represented, i.e., selected elements of the given depicted layer of the layout diagram are omitted, e.g., for simplicity of illustration. For simplicity of illustration, not all components in each of FIGS. 2A-2B (and likewise in other layout diagrams disclosed herein) are called out with a corresponding reference number. FIG. 2A and the other layout diagrams disclosed herein are examples of layout diagrams in which selected layers and/or selected elements of depicted given layers, have been omitted. In some embodiments, the layout diagram of FIG. 2A is part of a larger layout diagram.

In FIG. 2A, interconnection structure 202A(1) is an example of interconnection structure 102(1) or 102(2), or the like. FIG. 2A shows that the organization of interconnection structure 202A(1) includes columns CP1, CS1-CS7 and CP2, and slices SLC1-SLC4.

Figure 3A:
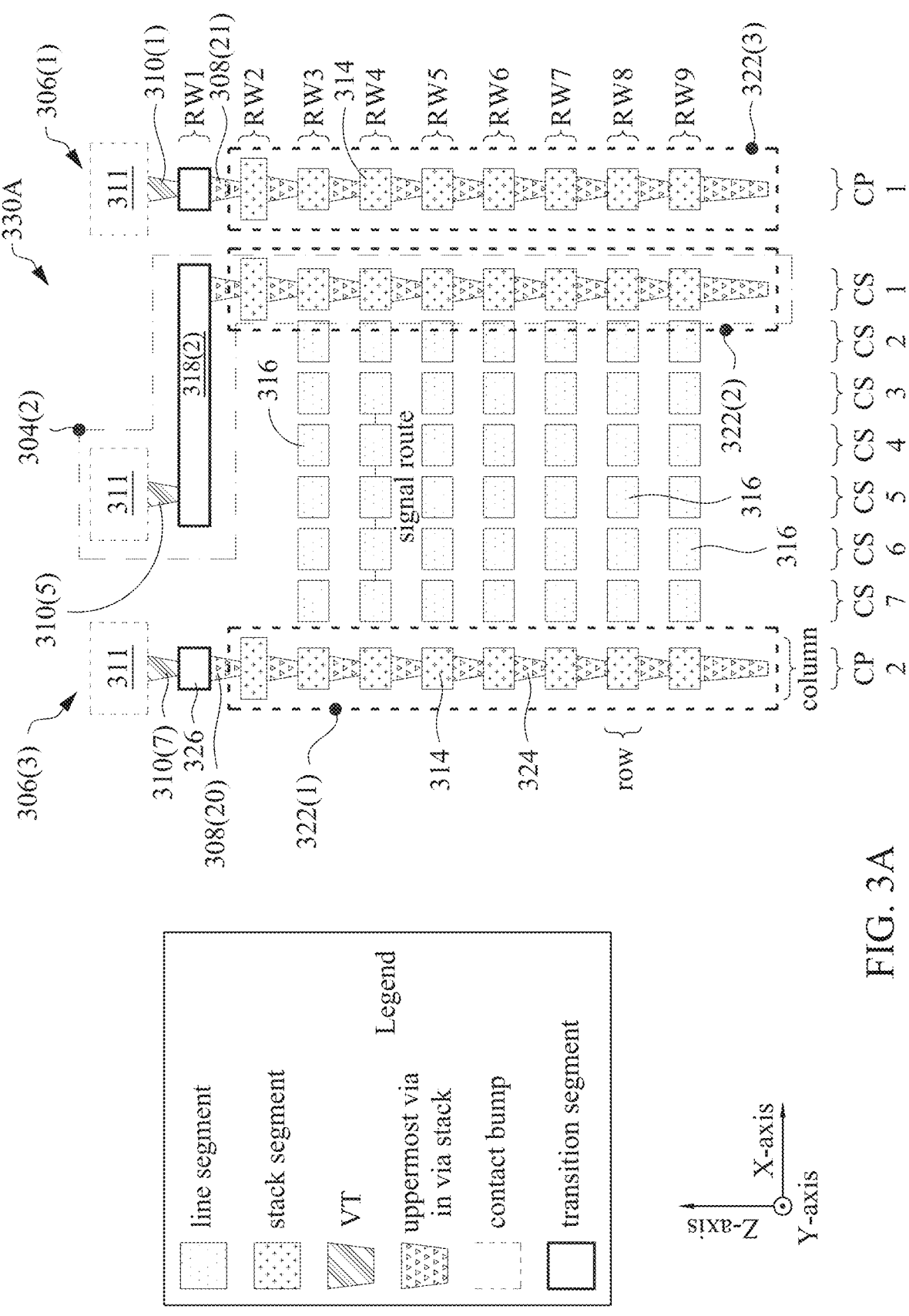
FIGS. 3A-3E are cross-sectional views of corresponding interconnection structures, in accordance with some embodiments.
Figure 3B:
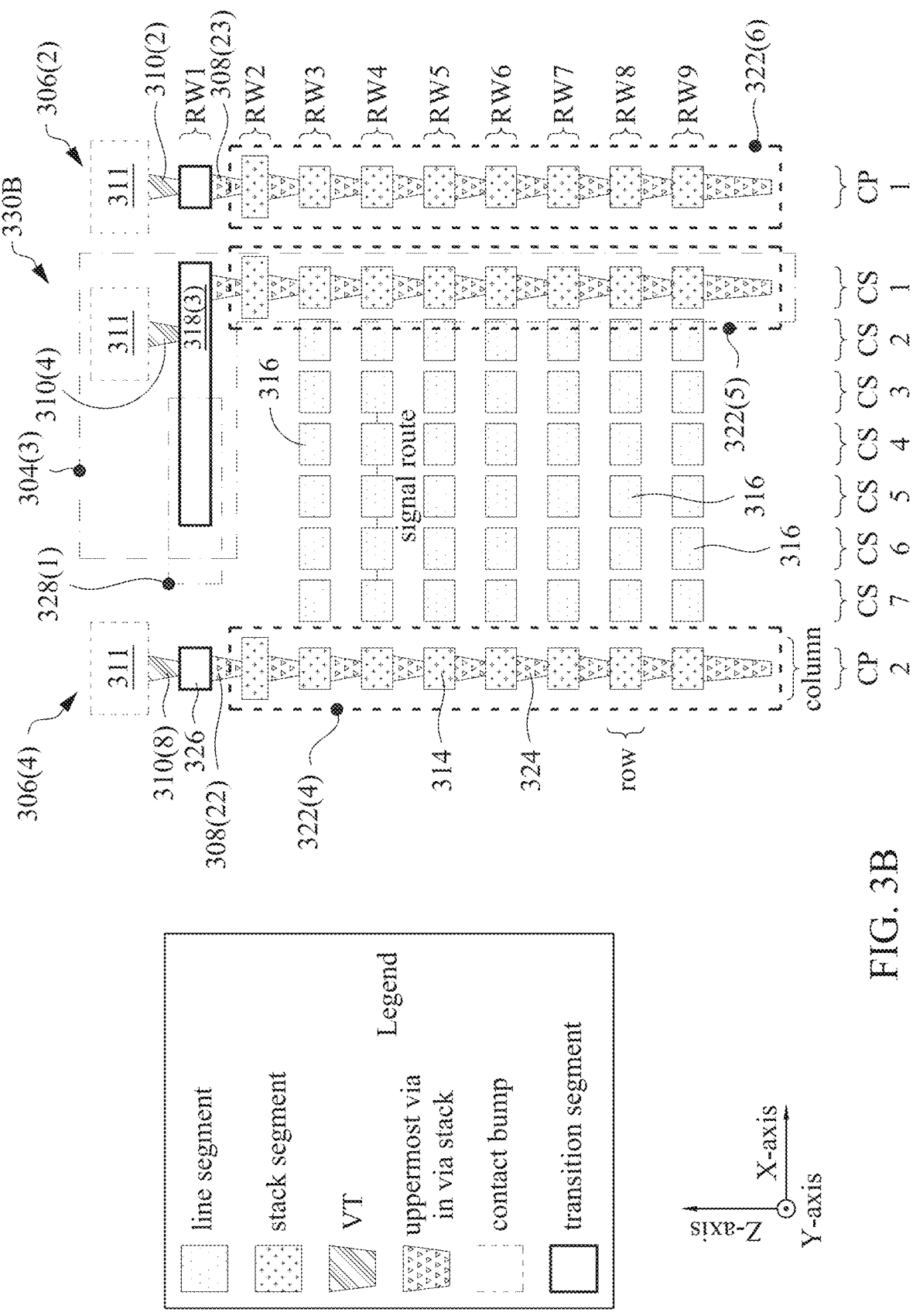

Interconnection structure 202A(1) includes: offset bump-towers 204(1)-204(4); non-offset bump-towers 206(1)-206(4); uppermost vias 208(1)-208(4) in corresponding via stacks (regarding via 208(2), sec via stack 322(2) in FIG. 3A; regarding via 208(3), see via stack 322(5) in FIG. 3B, or the like); stack segments 214; line segments 216; offsetting transition segments 218(1)-218(4); non-offsetting transition segments (326 FIGS. 3A-3B); via-to-transition-element (VT) structures 210(1)-210(8); and contact bumps 211.

The vias and VT structures are in corresponding interconnection layers. The stack segments, line segments and transition segments are in corresponding metallization layers. The metallization layer having the transition segments is referred to as a transition layer. In FIG. 2A, line segments 216 in columns CS1-CS7 correspond to line segments 316 in row RW3 of FIGS. 3A-3B.

Offset bump-tower 204(1) includes: an instance of stack segment 214; via 208(1); offsetting transition segment 218(1); VT structure 210(3); and an instance of contact bump 211.

Segment 218(1) extends parallel to the X-axis, from a first location in terms of the Y-axis and the X-axis (YX-location) at the intersection of column CS1 and slice SLC1, i.e., YX-location loc(CS1, SLC1), to a second YX-location loc (CS2, SLC1). At first YX-location loc(CS1, SLC1), segment 218(1) overlaps via 208(1). At second YX-location loc (CS2, SLC1), segment 218(1) underlaps VT structure 210(3), and VT structure 210(3) underlaps an instance of contact bump 211. Because of transition segment 218(1), VT structure 210(3), and thereby the corresponding instance of contact bump 211, are offset from via 208(1).

Offset bump-tower 204(2) includes: an instance of stack segment 214; via 208(2); offsetting transition segment 218(2); VT structure 210(5); and an instance of contact bump 211.

Segment 218(2) extends parallel to the X-axis, from a first YX-location loc(CS1, SLC2) to a second YX-location loc (CS5/6, SLC2), where CS5/6 denotes the gap between columns CS5 and CS6. At first YX-location loc(CS1, SLC2), segment 218(2) overlaps via 208(2). At second YX-location loc(CS5/6, SLC2), segment 218(2) underlaps VT structure 210(5), and VT structure 210(5) underlaps an instance of contact bump 211. Because of transition segment 218(2), VT structure 210(5), and thereby the corresponding instance of contact bump 211, are offset from via 208(2).

Offset bump-tower 204(3) includes: an instance of stack segment 214; via 208(3); offsetting transition segment 218(3); VT structure 210(4); and an instance of contact bump 211.

Segment 218(3) extends parallel to the X-axis, from a first YX-location loc(CS1, SLC3), to a second YX-location loc (CS2, SLC3). At first YX-location loc(CS1, SLC3), segment 218(3) overlaps via 208(3). At second YX-location loc(CS2, SLC3), segment 218(3) underlaps VT structure 210(4), and VT structure 210(4) underlaps an instance of contact bump 211. Because of transition segment 218(3), VT structure 210(4), and thereby the corresponding instance of contact bump 211, are offset from via 208(3).

Offset bump-tower 204(4) includes: an instance of stack segment 214; via 208(4); offsetting transition segment 218(4); VT structure 210(6); and an instance of contact bump 211.

Segment 218(4) extends parallel to the X-axis, from a first YX-location loc(CS1, SLC4) to a second YX-location loc (CS5/6, SLC4). At first YX-location loc(CS1, SLC4), segment 218(4) overlaps via 208(4). At second YX-location loc(CS5/6, SLC4), segment 218(4) underlaps VT structure 210(6), and VT structure 210(6) underlaps an instance of contact bump 211. Because of transition segment 218(4), VT structure 210(6), and thereby the corresponding instance of contact bump 211, are offset from via 208(4).

Non-offset bump-tower 206(1) includes: an instance of stack segment 214; via 308(21) (FIG. 3A); an instance of a non-offsetting transition segment 326 (FIG. 3A); VT structure 210(1); and an instance of contact bump 211. Via 308(21) (FIG. 3A) and VT structure 210(1) are at the same YX-location, namely YX-location loc(CP1, SLC2). VT structure 210(1) is not offset substantially from via 308(21) (FIG. 3A) relative to the Y-axis or the X-axis.

Non-offset bump-tower 206(2) includes: an instance of stack segment 214; via 308(23) (FIG. 3B); an instance of a non-offsetting transition segment 326 (FIG. 3B); VT structure 210(2); and an instance of contact bump 211. Via 308(23) (FIG. 3B) and VT structure 210(2) are at the same YX-location, namely YX-location loc(CP1, SLC4). VT structure 210(2) is not offset substantially from via 308(23) (FIG. 3B) relative to the Y-axis or the X-axis.

Non-offset bump-tower 206(3) includes: an instance of stack segment 214; via 308(20) (FIG. 3A); an instance of a non-offsetting transition segment 326 (FIG. 3A); VT structure 210(7); and an instance of contact bump 211. Via 308(20) (FIG. 3A) and VT structure 210(7) are at the same YX-location, namely YX-location loc(CP2, SLC1). VT structure 210(7) is not offset substantially from via 308(20) (FIG. 3A) relative to the Y-axis or the X-axis.

Non-offset bump-tower 206(4) includes: an instance of stack segment 214; via 308(22) (FIG. 3B); an instance of a non-offsetting transition segment 326 (FIG. 3B); VT structure 210(8); and an instance of contact bump 211. Via 308(22) (FIG. 3B) and VT structure 210(8) are at the same YX-location, namely YX-location loc(CP2, SLC3). VT structure 210(8) is not offset substantially from via 308(22) (FIG. 3B) relative to the Y-axis or the X-axis.

In FIG. 2A, each of vias 208(1)-208(4) is in column CS1. As such, relative to the X-axis in FIG. 2A, each of vias 208(1)-208(4) is described as being in an outer region of interconnection structure 202C in some embodiments. In some embodiments, each of vias 208(1)-208(4) is described as being in a peripheral region of interconnection structure 202C. Accordingly, relative to the X-axis in FIG. 2A, vias 208(1)-208(4) are arranged asymmetrically when considering interconnection structure 202A(1) as a whole.

In FIG. 2A, the VT structures of adjacent offset bump-towers are in different columns. Regarding adjacent offset bump-towers 204(1) and 204(2), VT structures 210(3) and 210(5) are correspondingly in columns CS2 and CS5/6. Regarding adjacent offset bump-towers 204(2) and 204(3), VT structures 210(5) and 210(4) are correspondingly in columns CS5/6 and CS2. Regarding adjacent offset bump-towers 204(3) and 204(4), VT structures 210(4) and 210(6) are correspondingly in columns CS2 and CS5/6.

In some embodiments, each of transition segments 218 (1)-218(4) is described as having a regular polygon shape. In some embodiments, a regular polygon is defined as a polygon for which all sides have equal length and all interior angles are equal.

In some embodiments, each of transition segments 218 (1)-218(4) is described as having a convex polygon shape. In some embodiments, a convex polygon is defined as polygon for which all interior angles are less than 180 degrees (180°). In some embodiments, a convex polygon is defined as a polygon for which all diagonals are inside the polygon. In some embodiments, each of transition segments 218(1)-218(4) is described as having a rectangle shape. Relative to the Y-axis, each of transition segments 218(1)-218(4) has a width substantially corresponding to a minimum width for a segment in the transition layer according to the corresponding semiconductor process technology node.

Relative to the Y-axis, each stack segment 214 has a length sufficient to span a corresponding one of vias 208 (1)-208(4) or VT structure 210(1)-210(2) and 210(7)-210(8) and extend a minimum segment-overhang distance beyond each of opposite sides of the corresponding via or VT structure, the minimum segment-overhang distance being related to the corresponding metallization layer in accordance with the corresponding semiconductor process technology node. A length of a given stack segment is substantially smaller than a length of a given line segment. Conversely, a length of a given line segment is substantially greater than a length of a given stack segment.

In FIG. 2A, each of columns CS2-CS7 has a corresponding instance of line segment 216. For each of columns CS2-CS7, the corresponding instance of line segment 216 represents an uppermost instance of line segment 216 in a stack (FIGS. 3A-3B) of instances of line segment 216. More generally, in some embodiments, for at least a majority of columns CS1-CS7, each column amongst at least the majority of columns CS1-CS7 has an instance of line segment 216.

Instances of line segment 216, and some instances of stack segment 214, are routing segments that form portions of corresponding signal paths and so are configured for carrying/conducting corresponding routing signals for/of circuits, or the like. Examples of routing signals include input/output (I/O) signals, data signals, control signals, or the like. Accordingly, in some embodiments, such instances of line segment 216 are referred to as instances of routing line segment 216, and such instances of stack segment 214 are referred to as routing instances of stack segment 214.

Some instances of stack segment 214 are corresponding parts of a power grid (PG) of the corresponding device. Accordingly, in some embodiments, such instances of stack segment 214 are referred to as PG instances of stack segment 214 and are configured for carrying/conducting a corresponding reference voltage of the device, e.g., VDD, VSS, or the like. In FIG. 2A, the instances of stack segment 214 in columns CP1 and CP2 are PG instances (PG columns), accordingly the letter P in each of the alphanumeric text strings CP1 and CP2 is intended to connote that the corresponding column includes one or more PG instances of stack segment 214. While columns CP1 and CP2 of FIG. 2A are free from including a routing instance of stack segment 214, not all columns that include one or more PG instances of stack segment 214 are free from including one or more routing instances of stack segment 214; for example, see column CP6 of FIG. 2D, or the like.

Regarding FIG. 2A, in some embodiments, for at least a majority of columns CS1-CS7, each column in the majority is free from including an instance of line segment 216 that is a PG line segment.

In some embodiments, each of columns CS1-CS7 is free from including an instance of line segment 216 that is a PG line segment. Accordingly, the letter S in each of the alphanumeric text strings CS1-CS7 is intended to connote that the corresponding column includes one or more routing instances of line segment 216. While each of columns CS1-CS7 of FIG. 2A typically is free from including a PG instance of line segment 216, not all columns that include one or more routing instances of line segment 216 necessarily are free from including one or more PG instances of line segment 216.

According to another approach for an interconnection structure that is compatible with an HBM standard, only non-offset bump-towers are used. Consequently, the line counterparts according to the other approach of line segments 216 are piecewise-continuous lines that are formed of short sections which intersect each other at about a 45 degree angle resulting in staggered or wavy line counterpart which increases the lengths of the line counterparts and decreases routability. By contrast, the use of offset bump-towers, e.g., 204(1)-204(4), facilitates the instances of line segment 216 being substantially straight, which reduces the length of the instances of line segment 216, and increases the routability of interconnection structure 202A as compared to the other approach.

In some embodiments of FIG. 2A, relative to the X-axis, the pitch of columns CS1-CS7 is a first multiple of a unit of distance-measure, and the pitch of columns CP1-CP2 is a second multiple of the unit of distance-measure.

In some embodiments of FIG. 2A, relative to the X-axis, columns CS1-CS7 are separated from each other by the same distance that column CP1 is separated from column CS1 and that column CS7 is separated from column CP2, i.e., taken together, columns CP1, CS1-CS7 and CP2 have a pitch that is a multiple of the unit of distance-measure. In some embodiments, the second multiple is the same as the first multiple. In some embodiments, the unit of distance-measure is 1.0 CPP. In some embodiments, CCP is an acronym for contacted poly pitch. A value for CPP is determined, e.g., by the design rules and scale of the corresponding semiconductor process technology node. Here, the word 'poly' in the term CPP does not necessarily imply that gate lines in multi-chip systems that include an interconnection structure based correspondingly on FIGS. 3A-3B are to be formed of polysilicon but instead represents a historical convenience—gate structures in ICs manufactured according to one or more predecessor semiconductor process technology nodes often were formed of polysilicon which lead to the term 'poly' being used colloquially to mean 'gate line.'

Figure 2B:
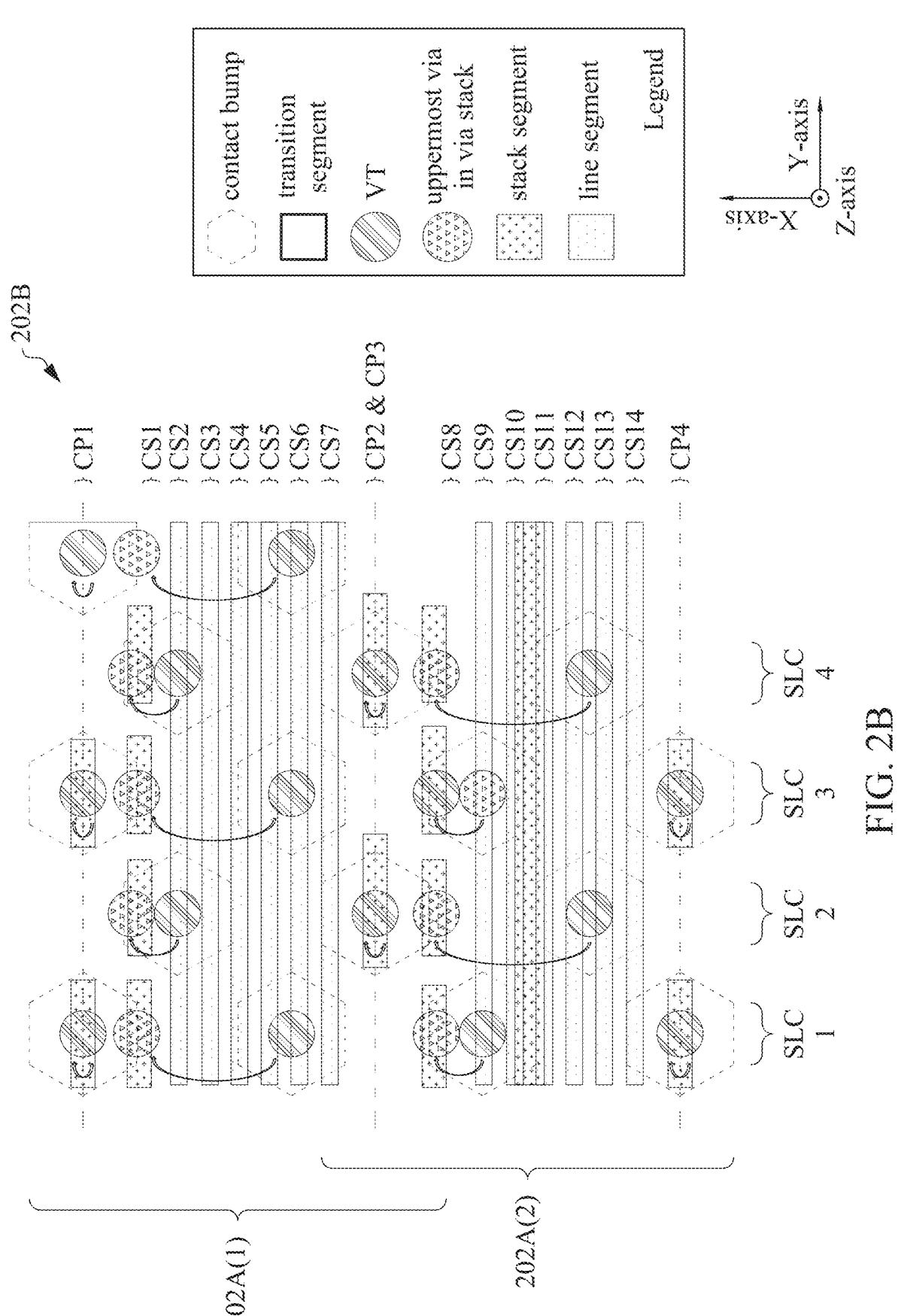

FIG. 2B is a layout diagram of an interconnection structure 202B, in accordance with some embodiments.

In FIG. 2B, interconnection structure 202B is an example of interconnection structure 102(1) or 102(2), or the like. FIG. 2B shows that the organization of interconnection structure 202B includes not only columns CP1, CS1-CS7 and CP2 and slices SLC1-SLC4 of FIG. 2A, but further includes columns CP3-CP4 and CS8-CS14.

Interconnection structure 202B is a combination of interconnection structure 202A(1) of FIG. 2A and a version of interconnection structure 202A(1), namely interconnection structure 202A(2). Relative to a location of interconnection structure 202A(1) on the Y-axis, interconnection structure 202A(2) is a copy of interconnection structure 202A(1) that has been shifted a distance of one slice along the Y-axis relative to the location of interconnection structure 202A(1). In some embodiments, interconnection structure 202A(2) is described as having been shifted one slice to the left of interconnection structure 202A(1).

The organization of interconnection structure 202A(2) includes columns CP3-CP4 and CS8-CS14. Columns CP3-CP4 and CS8-CS14 of interconnection structure 202A(2) correspond to columns CP1-CP2 and CS1-CS7 of interconnection structure 202A(1). Relative to the X-axis in FIG. 2B, column CP3 of interconnection structure 202A(2) overlaps column CP2 of interconnection structure 202A(1), hence the overlapped column is labeled CP2 & CP3 in FIG. 2B. Column CP3 shares the components/structures of column CP2.

Figure 2C:
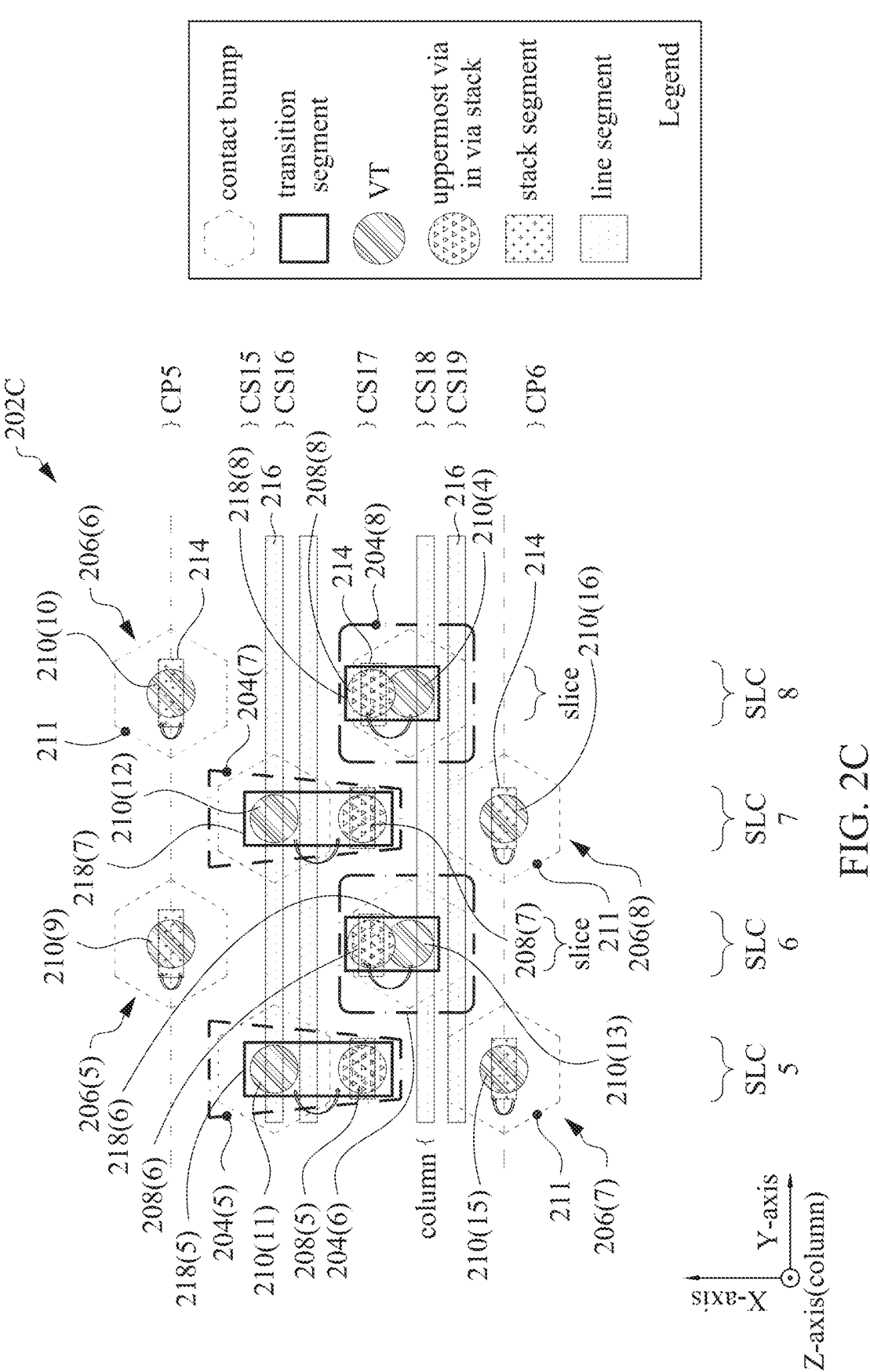

FIG. 2C is a layout diagram of an interconnection structure 202C, in accordance with some embodiments.

Interconnection structure 202C of FIG. 2C is similar to interconnection structure 202A(1) of FIG. 2A. For brevity, the discussion will focus on differences of interconnection structure 202C as compared to interconnection structure 202A(1) rather than on similarities.

In FIG. 2C, interconnection structure 202C is an example of interconnection structure 102(1) or 102(2), or the like. FIG. 2C shows that the organization of interconnection structure 202C includes columns CP5, CS15-CS19 and CP6, and slices SLC5-SLC8.

Interconnection structure 202C includes: offset bump-towers 204(5)-204(8); non-offset bump-towers 206(5)-206 (8); uppermost vias 208(5)-208(8) in corresponding via stacks (not shown but see via stacks 322(1)-322(3) in FIG. 3A, via stacks 322(4)-322(6) in FIG. 3B, or the like); stack segments 214; line segments 216; offsetting transition segments 218(5)-218(8); non-offsetting transition segments (not shown but see FIGS. 3A-3B, or the like); VT structures 210(9)-210(16); and contact bumps 211.

Offset bump-tower 204(5) includes: an instance of stack segment 214; via 208(5); offsetting transition segment 218 (5); VT structure 210(11); and an instance of contact bump 211.

Segment 218(5) extends parallel to the X-axis, from a first YX-location loc(CS17, SLC5), to a second YX-location loc(CS15, SLC5). At first YX-location loc(CS17, SLC5), segment 218(5) overlaps via 208(5). At second YX-location loc(CS15, SLC5), segment 218(5) underlaps VT structure 210(11), and VT structure 210(11) underlaps an instance of contact bump 211. Because of transition segment 218(5), VT structure 210(11), and thereby the corresponding instance of contact bump 211, are offset from via 208(5).

Offset bump-tower 204(6) includes: an instance of stack segment 214; via 208(6); offsetting transition segment 218 (6); VT structure 210(13); and an instance of contact bump 211.

Segment 218(6) extends parallel to the X-axis, from a first YX-location loc(CS17, SLC6) to a second YX-location loc(CS18, SLC6). At first YX-location loc(CS17, SLC6), segment 218(6) overlaps via 208(6). At second YX-location loc(CS18, SLC6), segment 218(6) underlaps VT structure 210(13), and VT structure 210(13) underlaps an instance of contact bump 211. Because of transition segment 218(6), VT structure 210(13), and thereby the corresponding instance of contact bump 211, are offset from via 208(6).

Offset bump-tower 204(7) includes: an instance of stack segment 214; via 208(7); offsetting transition segment 218 (7); VT structure 210(12); and an instance of contact bump 211.

Segment 218(7) extends parallel to the X-axis, from a first YX-location loc(CS17, SLC7), to a second YX-location loc(CS15, SLC6). At first YX-location loc(CS17, SLC7), segment 218(7) overlaps via 208(7). At second YX-location loc(CS15, SLC7), segment 218(7) underlaps VT structure 210(12), and VT structure 210(12) underlaps an instance of contact bump 211. Because of transition segment 218(7), VT structure 210(12), and thereby the corresponding instance of contact bump 211, are offset from via 208(7).

Offset bump-tower 204(8) includes: an instance of stack segment 214; via 208(8); offsetting transition segment 218 (8); VT structure 210(14); and an instance of contact bump 211.

Segment 218(8) extends parallel to the X-axis, from a first YX-location loc(CS17, SLC8) to a second YX-location loc(CS18, SLC8). At first YX-location loc(CS17, SLC8), segment 218(8) overlaps via 208(8). At second YX-location loc(CS18, SLC8), segment 218(8) underlaps VT structure 210(14), and VT structure 210(14) underlaps an instance of contact bump 211. Because of transition segment 218(8), VT structure 210(14), and thereby the corresponding instance of contact bump 211, are offset from via 208(8).

In FIG. 2C, each of vias 20(5)-208(8) is in column CS17. As such, relative to the X-axis in FIG. 2C, each of vias 208(5)-208(8) is in a central region of interconnection structure 202C. In some embodiments, relative to the X-axis in FIG. 2C, each of vias 208(5)-208(8) is described as being in an inner region of interconnection structure 202C. In some embodiments, relative to the X-axis in FIG. 2C, each of vias 208(5)-208(8) is described as being in a middle region of interconnection structure 202C. Accordingly, relative to the X-axis in FIG. 2C, vias 208(5)-208(8) are arranged symmetrically when considering interconnection structure 202C as a whole.

In FIG. 2C, VT structures 210(11) and 210(12) in column CS15 whereas VT structures 210(13) and 210(14) are in column CS18. Accordingly, relative to the X-axis in FIG. 2C, VT structures 210(11)-210(14), and thus the corresponding instances of contact bump 211, are arranged asymmetrically relative to the X-axis.

In FIG. 2C, the VT structures of offset bump-towers in adjacent slices are in different columns. Regarding offset bump-towers 204(5) and 204(6) correspondingly in adjacent slices SLC5 and SLC6, VT structures 210(11) and 210(13) are correspondingly in columns CS15 and CS18. Regarding offset bump-towers 204(6) and 204(7) correspondingly in adjacent slices SLC6 and SLC7, VT structures 210(13) and 210(12) are correspondingly in columns CS18 and CS15. Regarding offset bump-towers 204(7) and 204(8) correspondingly in adjacent slices SLC7 and SLC8, VT structures 210(12) and 210(14) are correspondingly in columns CS15 and CS18.

Figure 2D:
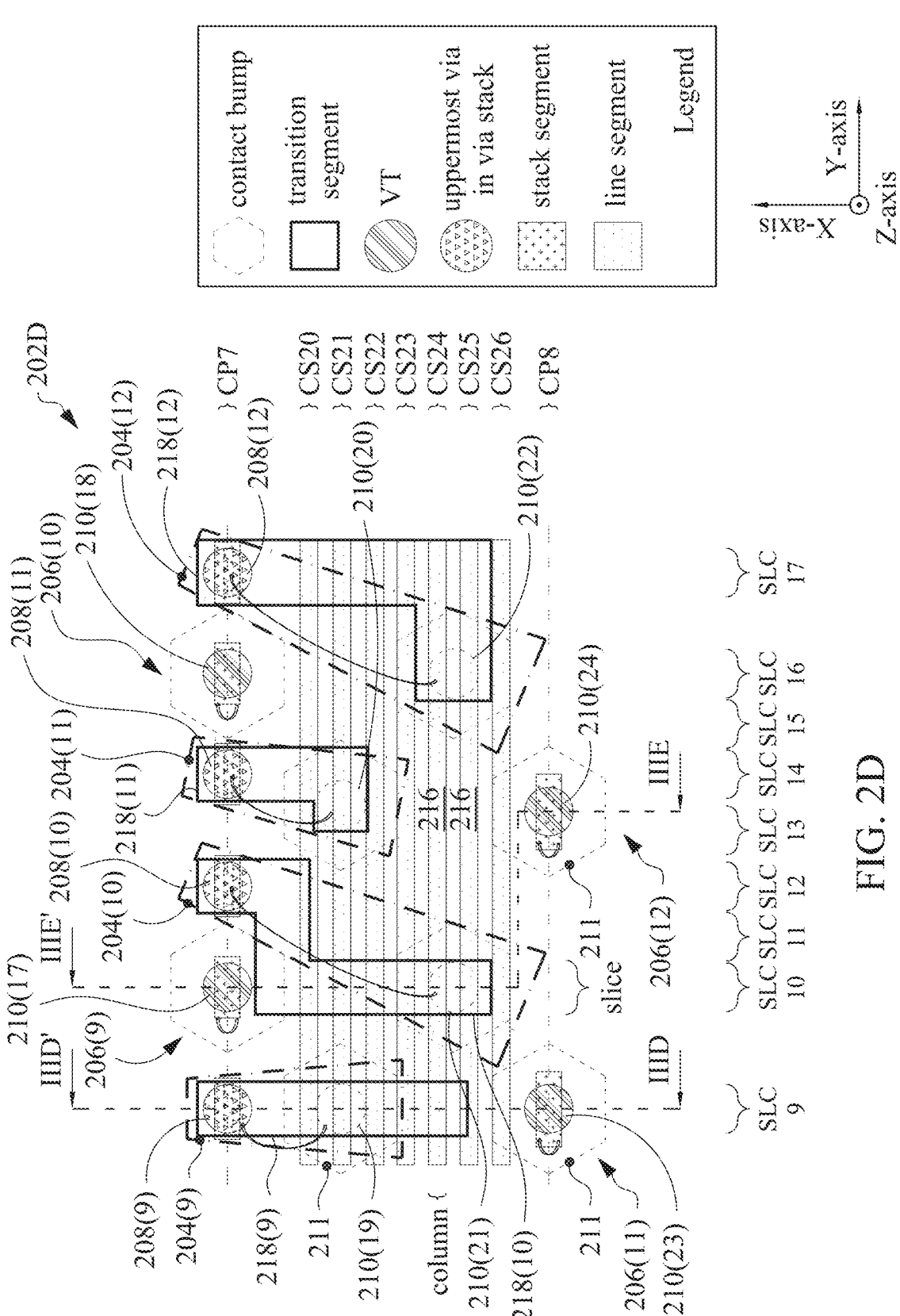

FIG. 2D is a layout diagram of an interconnection structure 202D, in accordance with some embodiments.

Interconnection structure 202D of FIG. 2D is similar to interconnection structure 202A(1) of FIG. 2A. For brevity, the discussion will focus on differences of interconnection structure 202D as compared to interconnection structure 202A(1) rather than on similarities.

In FIG. 2D, interconnection structure 202D is an example of interconnection structure 102(1) or 102(2), or the like. FIG. 2D shows that the organization of interconnection structure 202D includes columns CP7, CS20-CS26 and CP8, and slices SLC9-SLC17.

In FIG. 2D, section line IIIE-IIIE' is an offset sectional line in which the cutting plane for the offset section is stepped or offset at one or more right angle bends. In some embodiments, the cutting plane that produces an offset section is referred to as a piecewise-continuous cutting plane. Section line IIID-IIID' corresponds to cross-sectional view 330D of FIG. 3D. Section line IIIE-IIIE' corresponds to the cross-sectional view 330E of FIG. 3E.

In FIG. 2D, interconnection structure 202D is an example of interconnection structure 102(1) or 102(2), or the like. FIG. 2D shows that the organization of interconnection structure 202D includes columns CP7, CS20-CS26 and CP8, and slices SLC1-SLC4.

Figure 3C:
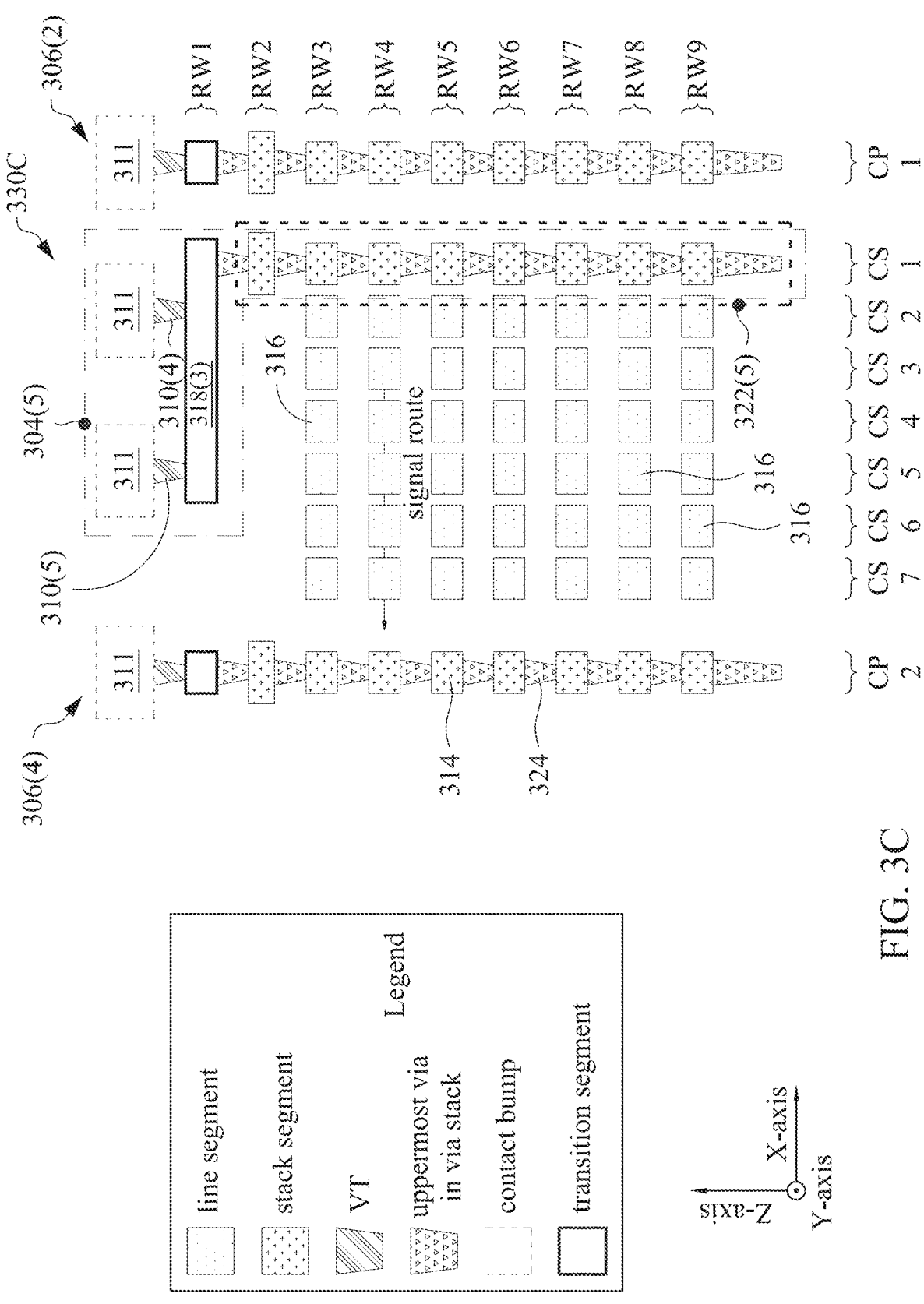
Figure 3D:
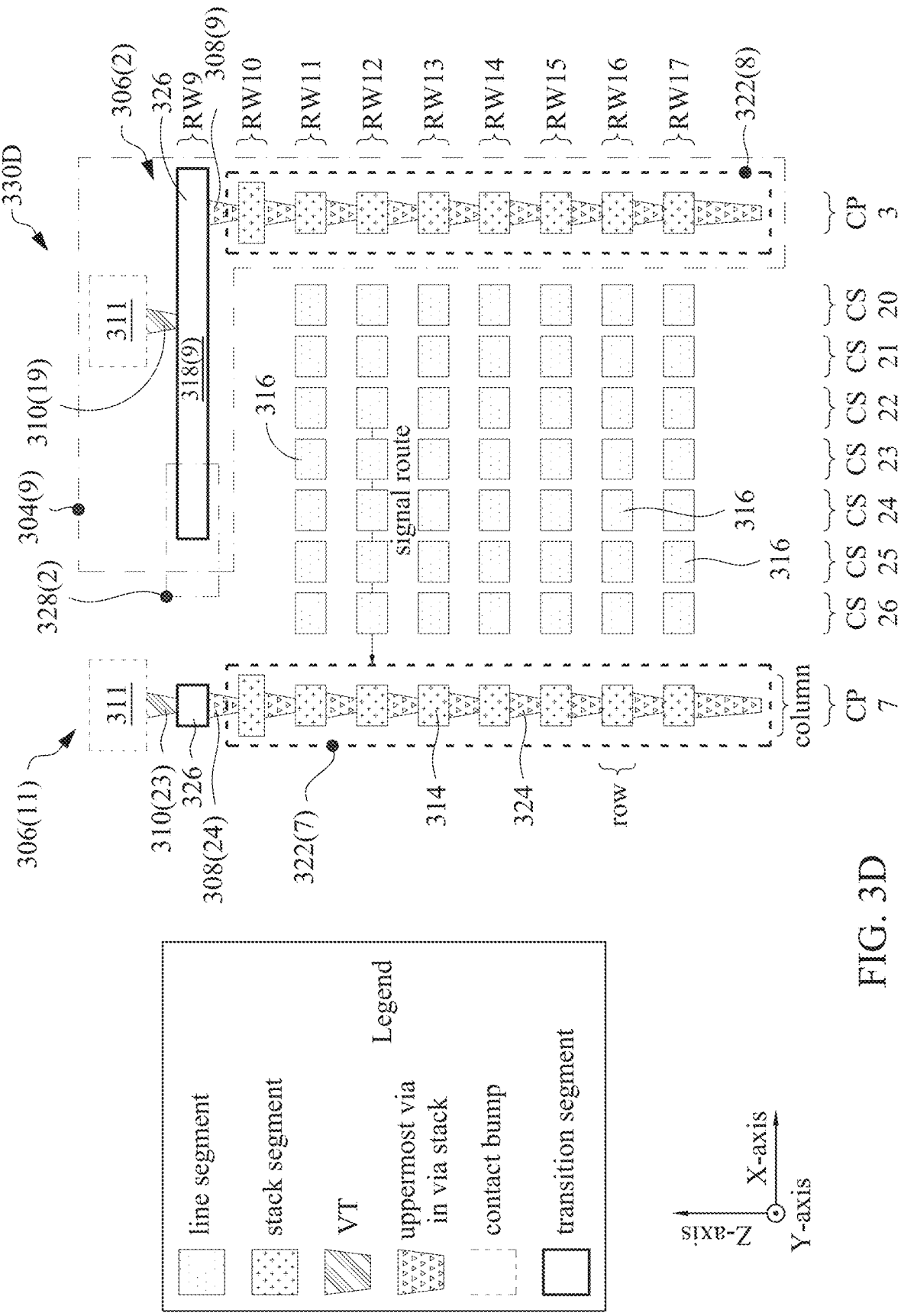
Figure 3E:
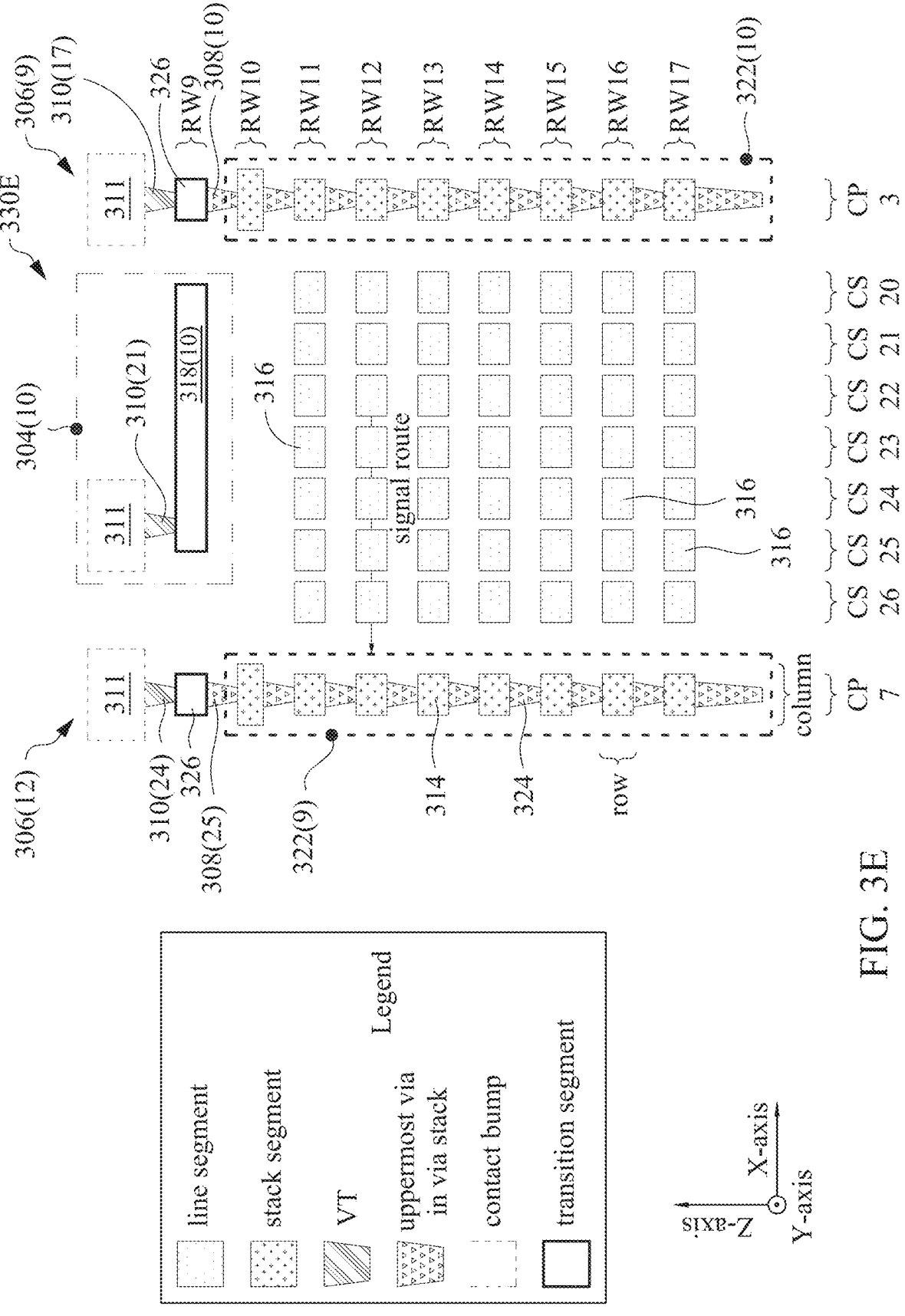

In FIG. 2D, line segments 216 in columns CS20-CS26 correspond to line segments 316 in row RW11 of FIGS. 3D-3E.

Interconnection structure 202D includes: offset bump-towers 204(1)-204(12); non-offset bump-towers 206(9)-206(12); uppermost vias 208(9)-208(12) in corresponding via stacks (regarding via 208(9), see via stack 322(8) in FIG. 3D; regarding via 208(10), see via stack 322(10) in FIG. 3E, or the like); stack segments 214; line segments 216; offsetting transition segments 218(9)-218(12); non-offsetting transition segments (326 FIGS. 3D-3E); VT structures 210(19)-210(24); and contact bumps 211.

Offset bump-tower 204(9) includes: an instance of stack segment 214; via 208(9); offsetting transition segment 218(9); VT structure 210(19); and an instance of contact bump 211.

Segment 218(9) extends parallel to the X-axis, from a first YX-location loc(CP7, SLC9), to a second YX-location loc(CS21, SLC9). At first YX-location loc(CP7, SLC9), segment 218(9) overlaps via 208(9). At second YX-location loc(CS21, SLC9), segment 218(9) underlaps VT structure 210(19), and VT structure 210(19) underlaps an instance of contact bump 211. Because of transition segment 218(9), VT structure 210(19), and thereby the corresponding instance of contact bump 211, are offset from via 208(9).

Offset bump-tower 204(10) includes: an instance of stack segment 214; via 208(10); offsetting transition segment 218(10); VT structure 210(21); and an instance of contact bump 211.

Segment 218(10) extends partly parallel to the X-axis and partly parallel to the Y-axis, from a first YX-location loc (CP7, SLC12) to a second YX-location loc(CS24/25, SLC10), where CS24/25 denotes the gap between columns CS24 and CS25. At first YX-location loc(CP7, SLC12), segment 218(10) overlaps via 208(10). At second YX-location loc(CS24/25, SLC10), segment 218(10) underlaps VT structure 210(21), and VT structure 210(21) underlaps an instance of contact bump 211. Because of transition segment 218(10), VT structure 210(21), and thereby the corresponding instance of contact bump 211, are offset from via 208(10).

Offset bump-tower 204(11) includes: an instance of stack segment 214; via 208(11); offsetting transition segment 218(11); VT structure 210(20); and an instance of contact bump 211.

Segment 218(11) extends partly parallel to the X-axis and partly parallel to the Y-axis, from a first YX-location loc (CP7, SLC14), to a second YX-location loc(CS21, SLC13). At first YX-location loc(CP7, SLC14), segment 218(11) overlaps via 208(11). At second YX-location loc(CS21, SLC13), segment 218(11) underlaps VT structure 210(20), and VT structure 210(20) underlaps an instance of contact bump 211. Because of transition segment 218(11), VT structure 210(20), and thereby the corresponding instance of contact bump 211, are offset from via 208(9).

Offset bump-tower 204(12) includes: an instance of stack segment 214; via 208(12); offsetting transition segment 218(12); VT structure 210(22); and an instance of contact bump 211.

Segment 218(12) extends partly parallel to the X-axis and partly parallel to the Y-axis, from a first YX-location loc (CP7, SLC17) to a second YX-location loc(CS24/25, SLC16). At first YX-location loc(CP7, SLC17), segment 218(12) overlaps via 208(12). At second YX-location loc (CS24/25, SLC16), segment 218(12) underlaps VT structure 210(22), and VT structure 210(22) underlaps an instance of contact bump 211. Because of transition segment 218(12), VT structure 210(22), and thereby the corresponding instance of contact bump 211, are offset from via 208(12).

In some embodiments, offsetting transition segment 218 (9) is described as having a regular polygon shape. In some embodiments, transition segment 218(9) is described as having a convex polygon shape.

In some embodiments, each of offsetting transition segments 218(10)-218(12) is described as an irregular polygon. In some embodiments, each of transition segments 218(10)-218(12) is described as a concave polygon. In some embodiments, transition segment 218(10) is described as a concave polygon having a Z-shape. In some embodiments, each of transition segments 218(11)-218(12) is described as a concave polygon having a P-shape. In some embodiments, each of transition segments 218(11)-218(12) is described as a concave polygon having an L-shape.

In FIG. 2D, each of vias 208(9)-208(12) is in column CP7. As such, relative to the X-axis in FIG. 2D, each of vias 208(9)-208(12) is described as being in an outer region of interconnection structure 202D in some embodiments. In some embodiments, each of vias 208(9)-208(12) is described as being in a peripheral region of interconnection structure 202D. Accordingly, relative to the X-axis in FIG. 2D, vias 208(9)-208(12) are arranged asymmetrically when considering interconnection structure 202D as a whole.

In FIG. 2D, the VT structures of offset bump-towers in adjacent slices are in different columns. Regarding adjacent offset bump-towers 204(9) and 204(10), VT structures 210(19) and 210(21) are correspondingly in columns CS21 and CS24/25. Regarding adjacent offset bump-towers 204(10) and 204(11), VT structures 210(21) and 210(20) are correspondingly in columns CS5/6 and CS21. Regarding adjacent offset bump-towers 204(11) and 204(12), VT structures 210(20) and 210(22) are correspondingly in columns CS21 and CS24/25.

In FIG. 2D, the instances of stack segment 214 in non-offset bump-towers 206(9) and 206(10) are PG instances of stack segment 214 and are configured for carrying/conducting a corresponding reference voltage of the device, e.g., VDD, VSS, or the like. The instances of stack segment 214 in offset bump-towers 204(9)-204(12) are routing instances of stack segments 214. As such, column CP7 is an example that informs the point recited above that not all columns that include one or more PG instances of stack segment 214 are free from including one or more routing instances of stack segment 214.

FIGS. 3A-3B are corresponding cross-sectional views 330A and 330B of an interconnection structure, in accordance with some embodiments.

The device corresponding to cross-sectional views 330A-330B of FIGS. 3A-3B is an example of device that includes interconnection structure 202A(1) of FIG. 2A. Cross-sectional view 330A of FIG. 3A corresponds to section IIIA-IIIA' of FIG. 2A. Cross-sectional view 330B of FIG. 3B corresponds to section IIIB-IIIB' of FIG. 2A. It is to be recalled that each of section line IIIA-IIIA' and section line IIIB-IIIB' of FIG. 2A is an offset sectional line in which the cutting plane for the offset section is a piecewise-continuous cutting plane.

In FIGS. 3A-3B, as well as in other cross-sectional views disclosed herein, an orthogonal Cartesian coordinate system is assumed in which a first direction is parallel to the X-axis, a second direction is parallel to the Y-axis and a third direction is parallel to the Z-axis. For simplicity of illustration, not all components in each of FIGS. 3A-3B (and likewise in other cross-sectional views disclosed herein) are called out with a corresponding reference number.

Cross-sectional views 330A-330B follow a similar numbering scheme to that of the layout diagram of FIG. 2A. Though some components correspond, some components also differ. To help identify components which correspond but nevertheless have differences, the numbering convention for FIGS. 3A-3B uses 3-series numbers for cross-sectional views 330A-330B while FIG. 2A use 2-series numbers. For example, offsetting transition segment 318(2) in FIG. 3A corresponds to offsetting transition segment 218(2) in FIG. 2A, and offsetting transition segment 318(3) in FIG. 3B corresponds to offsetting transition segment 218(3) in FIG.

2A. For brevity, the discussion will focus more on differences between FIGS. 3A-3B and FIG. 2A than on similarities.

As viewed generally from left to right in FIG. 3A, cross-sectional view 330A includes: offset bump-tower 304(2); non-offset bump-towers 306(3) and 306(1); via stacks 322(1), 322(2) and 322(3); uppermost vias 308(20), 308(2) and 308(21); stack segments 314; vias other than uppermost vias, i.e., vias 324; line segments 316; offsetting transition segment 318(2); non-offsetting transition segments 326; VT structures 310(7), 310(5) and 310(1); and instances of contact bump 311.

Each instance of non-offsetting transition segment 326 has a size sufficient to span corresponding VT structures 310(1) and 310(7) and extend a minimum VT-overhang distance beyond each of opposite sides of corresponding VT structures 310(1) and 310(7), the minimum VT-overhang distance being related to the transition layer in accordance with the corresponding semiconductor process technology node.

In FIG. 3A (and in FIGS. 3B-3C as well), the transition layer corresponds to row RW1 and the metallization layers correspond to rows RW3-RW9. Relative to the Z-axis, the interconnection layers are not called out with labels but generally correspond to gaps between the rows. Uppermost vias 308(20), 308(2) and 308(21) are in an interconnection layer corresponding to the gap between rows RW1 and RW2. VT structures 310(7), 310(5) and 310(1) are in an interconnection layer corresponding to the gap between a layer that includes the instances of contact bump 311 and row RW1. In some embodiments, at least the lowermost instances of via 324 are through-silicon vias (TSVs).

Offsetting segment 318(2) extends parallel to the X-axis, from a first XZ-location loc(CS1, RW1) to a second XZ-location loc(CS5/6, RW1), where CS5/6 denotes the gap between columns CS5 and CS6. At first XZ-location loc(CS1, RW1), segment 318(2) overlaps via 308(2). At second XZ-location loc(CS5/6, RW1), segment 318(2) underlaps VT structure 310(5), and VT structure 310(5) underlaps an instance of contact bump 311. Because of transition segment 318(2), VT structure 310(5), and thereby the corresponding instance of contact bump 311, are offset from via 308(2).

In FIG. 3B, as viewed generally from left to right, cross-sectional view 330B includes: offset bump-tower 304(3); non-offset bump-towers 306(4) and 306(2); via stacks 322(4), 322(5) and 322(6); uppermost vias 308(22), 308(3) and 308(23); stack segments 314; vias other than uppermost vias, i.e., vias 324; line segments 316; offsetting transition segment 318(3); non-offsetting transition segments 326; VT structures 310(8), 310(4) and 310(2); and instances of contact bump 311.

Offsetting segment 318(3) extends parallel to the X-axis, from a first XZ-location loc(CS1, RW1) to a second XZ-location loc(CS2, RW1). At first XZ-location loc(CS1, RW1), segment 318(3) overlaps via 308(3). At second XZ-location loc(CS2, RW2), segment 318(3) underlaps VT structure 310(4), and VT structure 310(4) underlaps an instance of contact bump 311. Because of transition segment 318(3), VT structure 310(4), and thereby the corresponding instance of contact bump 311, are offset from via 308(3).

In FIG. 3B, offsetting segment 318(3) extends beyond second XZ-location loc(CS2, RW1) to a third location loc(CS5/6, RW1). In some embodiments, the portion of offsetting segment 318(3) that extends beyond second XZ-location loc(CS2, RW1) is optional and can be omitted, as indicated by the phantom/dashed box 328(1).

FIG. 3C is a cross-sectional view 330C of an interconnection structure, in accordance with some embodiments.

Cross-sectional view 330C of FIG. 3C is similar to cross-sectional view 330B of FIG. 3B. For brevity, the discussion will focus on differences of cross-sectional view 330C as compared to cross-sectional view 330B rather than on similarities.

In FIG. 3C, in an offset bump-tower 304(5), offsetting segment 318(3) extends beyond second XZ-location loc (CS2, RW1) to third location loc(CS5/6, RW1). Cross-sectional view 330C further includes VT structure 310(5) in third location loc(CS5/6, RW1), and a corresponding instance of contact bump 311, in third location loc(CS5/6, RW1). In some embodiments, offsettting transition segment 318(3) is described as a multibump transition segment because transition segment 318(3) underlaps VT structures 310(4) and 310(5). In some embodiments, FIG. 3C is described as a combination of FIGS. 3A and 3B.

FIGS. 3D-3E are corresponding cross-sectional views 330D and 330E of an interconnection structure, in accordance with some embodiments.

The device corresponding to cross-sectional views 330D-330E of FIGS. 3D-3E is an example of device that includes interconnection structure 202A(1) of FIG. 2A. Cross-sectional view 330D of FIG. 3D corresponds to section IIID-IIID' of FIG. 2D. Cross-sectional view 330E of FIG. 3E corresponds to section IIIE-IIIE' of FIG. 2D. It is to be recalled that section line IIIE-IIIE' of FIG. 2D is an offset sectional line in which the cutting plane for the offset section is a piecewise-continuous cutting plane.

Cross-sectional views 330D-330E correspondingly of FIGS. 3D-3E follow a similar numbering scheme to that of the layout diagram of FIG. 2D. Though some components correspond, some components also differ. To help identify components which correspond but nevertheless have differences, the numbering convention for FIGS. 3D-3E uses 3-series numbers for cross-sectional views 330D-330E while FIG. 2D uses 2-series numbers. For example, offsetting transition segment 318(9) in FIG. 3D corresponds to offsetting transition segment 218(9) in FIG. 2D, and offsetting transition segment 318(10) in FIG. 3E corresponds to offsetting transition segment 218(10) in FIG. 2D. For brevity, the discussion will focus more on differences between FIGS. 3D-3E and FIG. 2D than on similarities.

Cross-sectional views 330D-330E correspondingly of FIGS. 3D-3E are similar to cross-sectional views 330A-330B correspondingly of FIGS. 3A-3B. For brevity, the discussion will focus more on differences between FIGS. 3D-3E and FIGS. 3A-3B than on similarities.

As viewed generally from left to right in FIG. 3D, cross-sectional view 330D includes: offset bump-tower 304 (9); non-offset bump-tower 306(11); via stacks 322(23) and 322(8); uppermost vias 308(24) and 308(9); stack segments 314; vias other than uppermost vias, i.e., vias 324; line segments 316; offsetting transition segment 318(9); non-offsetting transition segments 326; VT structures 310(23) and 310(19); and instances of contact bump 311.

In FIGS. 3D-3E, the transition layer corresponds to row RW9 and the metallization layers correspond to rows RW10-RW17. Relative to the Z-axis, the interconnection layers are not called out with labels but generally correspond to gaps between the rows. Uppermost vias 308(24) and 308(9) are in an interconnection layer corresponding to the gap between rows RW9 and RW10. VT structures 310(23) and 310(19) are in an interconnection layer corresponding to the gap between a layer that includes the instances of contact bump 311 and row RW9. In some embodiments, at least the lowermost instances of via 324 are TSVs.

Offsetting segment 318(9) extends parallel to the X-axis, from a first ZX-location loc(CP3, RW9) to a second ZX-location loc(CS21/22, RW9), where CS21/22 denotes the gap between columns CS21 and CS22. At first XZ-location loc(CP3, RW9), segment 318(9) overlaps via 308(9). At second XZ-location loc(CS21/22, RW9), segment 318(9) underlaps VT structure 310(19), and VT structure 310(19) underlaps an instance of contact bump 311. Because of transition segment 318(9), VT structure 310(19), and thereby the corresponding instance of contact bump 311, are offset from via 308(9).

In FIG. 3D, offsetting segment 318(9) extends beyond second XZ-location loc(CP3, RW9) to a third location loc(CS25, RW9). In some embodiments, the portion of offsetting segment 318(9) that extends beyond second XZ-location loc(CS21/22, RW9) is optional and can be omitted, as indicated by the phantom/dashed box 328(2).

In FIG. 3E, as viewed generally from left to right, cross-sectional view 330E includes: a portion of offset bump-tower 304(10); non-offset bump-towers 306(12) and 306(9); via stacks 322(9) and 322(10); uppermost vias 308(25) and 308(10); stack segments 314; vias other than uppermost vias, i.e., vias 324; line segments 316; offsetting transition segment 318(10); non-offsetting transition segments 326; VT structures 310(24), 310(21) and 310(17); and instances of contact bump 311.

Offsetting segment 318(10) extends partly parallel to the X-axis and partly parallel to the Y-axis, from a first XZ-location (not shown in FIG. 3E because corresponding section line IIIE-IIIE' is an offset sectional line) to a second XZ-location loc(CS20, RW9), and from second XZ-location loc(CS20, RW9) to a third XZ-location loc(CS24/25, RW9), where CS24/25 denotes the gap between columns CS24 and CS25. At the first YX-location, segment 318(10) overlaps via 308(10) (not shown in FIG. 3E). At third XZ-location loc(CS24/25, RW9), segment 318(10) underlaps VT structure 310(21), and VT structure 310(21) underlaps an instance of contact bump 311. Because of transition segment 318(10), VT structure 310(21), and thereby the corresponding instance of contact bump 311, are offset from via 308(10).

Figure 4:
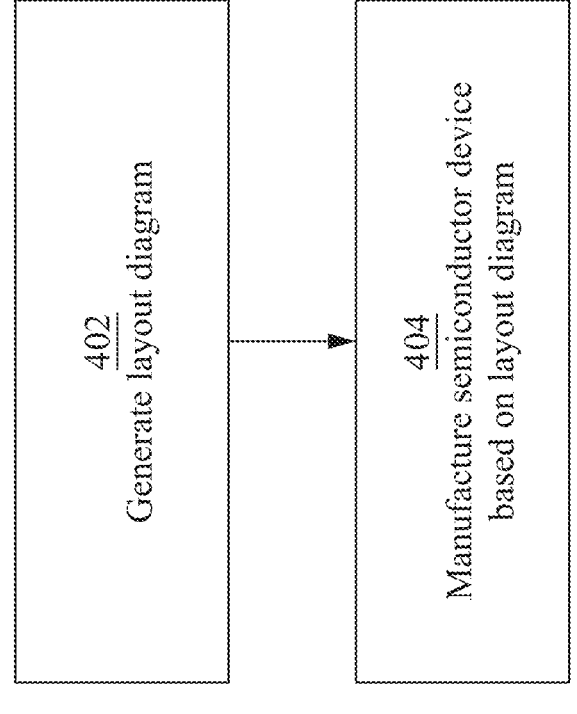

FIG. 4 is a flowchart 400 of a method of manufacturing a memory device, in accordance with some embodiments.

The method of flowchart (flow diagram) 400 is implementable, for example, using EDA system 600 (FIG. 6, discussed below) and an IC manufacturing system 700 (FIG. 7, discussed below), in accordance with some embodiments. Examples of a device which can be manufactured according to the method of flowchart 400 include devices based on the layout diagrams disclosed herein, devices corresponding to the cross-sectional views disclosed herein, or the like.

In FIG. 4, the method of flowchart 400 includes blocks 402-404. At block 402, a layout diagram is generated which, among other things, includes one or more of layout diagrams disclosed herein, layout diagrams corresponding to one or more of the cross-sectional views disclosed herein, or the like. Block 402 is implementable, for example, using EDA system 600 (FIG. 6, discussed below), in accordance with some embodiments. From block 402, flow proceeds to block 404.

At block 404, based on the layout diagram, at least one of (A) one or more photolithographic exposures are made or (B) one or more photolithography masks are fabricated or (C) one or more components in a layer of a device, e.g., a semiconductor device is fabricated. See discussion below of IC manufacturing system 700 in FIG. 7 below.

FIG. 5 is a flowchart 510 of a method of fabricating a device, in accordance with some embodiments.

Flowchart 510 is an example of block 404 of FIG. 4. Flowchart 510 includes blocks 512-524. Examples provided in the context of flowchart 510 assume first, second and third orthogonal directions that are, e.g., correspondingly parallel to the X-axis, Y-axis and Z-axis. The method of flowchart 510 is implementable, for example, using IC manufacturing system 700 (FIG. 7, discussed below), in accordance with some embodiments. Examples of a device which can be manufactured according to the method of flowchart 510 include devices based on the layout diagrams disclosed herein, devices corresponding to the cross-sectional views disclosed herein, or the like.

At block 512, offset bump-towers are formed. Examples of the offset bump-towers include offset bump-towers 204 (1)-204(4) of FIG. 2A, 204(5)-204(8) of FIG. 2C, 204(9)-204(12) of FIG. 2D, or the like. Block 512 includes block 514.

At block 514, via stacks are formed at first locations. Examples of the via stacks include via stacks 322(1)-322(3) of FIG. 3A, 322(4)-322(6) of FIG. 3B, 322(7)-322(8) of FIG. 3D, 322(9)-322(10) of FIG. 3E, or the like. Block 514 includes block 516.

At block 516, vias in interconnection layers and conductive segments in metallization layers are alternately formed. Examples of the metallization layers include the metallization layers corresponding to rows RW2-RW9 in FIGS. 3A-3C, RW10-RW17 in FIGS. 3D-3E, or the like. Block 516 includes block 518.

At block 518, for a first group of two or more offset bump-towers, the via stacks correspondingly of the first group are aligned to a first one of the columns, where the interconnection structure is arranged as an array that is organized into columns, rows and slices. Examples of the first group include the group of offset bump-towers 204(1)-204(2) which are aligned to column CS1 in FIG. 2A, the group of offset bump-towers 204(5)-204(8) which are aligned to column CS17 in FIG. 2C, the group of offset bump-towers 204(9)-204(12) which are aligned to column CP7 in FIG. 2D, or the like.

Flow exits block 518 back into block 516. Flow exits block 516 back into block 514. From block 514, flow proceeds to block 520.

At block 520, offsetting transition segments are formed in a transition layer to extend onto uppermost ones of vias in via stacks correspondingly at first locations, and to extend correspondingly to second locations. Examples of the off-setting transition segments include offsetting transition segments 218(1)-218(4) in FIG. 2A, 218(5)-218(8) in FIG. 2C, 218(9)-218(12) in FIG. 2D, or the like. For example, off-setting transition segment 218(2) of FIG. 2A extends from first YX-location loc(CS1, SLC2) to second YX-location loc(CS5/6, SLC2). For example, offsetting transition segment 218(6) of FIG. 2C extends from first YX-location loc(CS17, SLC6) to second YX-location loc(CS18, SLC6). For example, offsetting transition segment 218(10) of FIG. 2D extends from first YX-location loc(CP7, SLC12) to second YX-location loc(CS24/25, SLC10). From block 520, flow proceeds to block 522.

At block 522, VT structures are formed at the second locations correspondingly onto the transition segments. Examples of the VT structures include VT structures 210 (3)-210(5) of FIG. 2A, 210(11)-210(14) of FIG. 2C, 210 (19)-210(22) of FIG. 2D, or the like. For example, VT structure 210(5) of FIG. 2A is at second YX-location loc (CS5/6, SLC2). For example, VT structure 210(13) of FIG. 2C is at second YX-location loc(CS18, SLC6). For example, VT structure 210(21) of FIG. 2D is at second YX-location loc(CS24/25, SLC10). From block 522, flow proceeds to block 524.

At block 524, contact bumps are formed correspondingly on the VT structures at the second locations. Examples of the contact bumps at the second locations include the instances of contact bump 211 over VT structures 210(3)-210(6) in FIG. 2A, 210(11)-210(14) in FIG. 2B, 210(19)-210(22) in FIG. 2D, or the like.

In some embodiments, block 512 forms offset bump-towers and non-offset bump-towers. Examples of the non-offset bump-towers include non-offset bump-towers 206(1)-206(4) of FIG. 2A, 206(5)-206(8) of FIG. 2C, 206(9)-206 (12) of FIG. 2D, or the like.

In some embodiments in which block 512 forms offset bump-towers and non-offset bump-towers, block 520 forms offsetting transition segments and non-offsetting transition segments. In contrast to the offsetting transition segments, the non-offsetting transitions segments do not extend substantially beyond the corresponding first locations. Examples of the non-offsetting transition segments include non-offsetting transition segments 326 of FIGS. 3A-3E, or the like.

In some embodiments in which block 512 forms offset bump-towers and non-offset bump-towers and in which block 520 forms offsetting transition segments and non-offsetting transition segments, block 512 locates at least a given one of the non-offset bump-towers so that the via stack of the given non-offset bump-tower is also aligned with the first column of block 518. Examples of the given non-offset bump-tower include non-offset bump-towers 206(9)-206 (10) of FIG. 2D, or the like.

In some embodiments, block 518 also forms the first group of two or more offset bump-towers to be free from including a contact bump configured for a reference voltage. Examples of a first group which is free from including contact bump configured for a reference voltage include the group of offset bump-towers 204(1)-204(2) which are aligned to column CS1 in FIG. 2A, the group of offset bump-towers 204(5)-204(8) which are aligned to column CS17 in FIG. 2C, or the like.

In some embodiments, block 522 forms the VT structures, and thus block 524 forms the contact bumps, of adjacent offset bump-towers correspondingly to be in different columns. Examples of the VT structures being in different columns for adjacent offset bump-towers include offset bump-towers 204(1)-204(4) of FIG. 2A, 204(5)-204(8) of FIG. 2C, 204(9)-204(12) of FIG. 2D, or the like.

In some embodiments, block 522 forms at least some of the VT structures, and thus block 524 forms a corresponding at least some of the contact bumps, in slices which are free from including a via stack corresponding to an offset bump-tower. Examples of a VT structure which is formed in a slice that is free from including the via stack of the corresponding offset bump-tower include VT structure 210(21) of offset bump-tower 204(10) where VT structure 210(21) is in slice SLC10, VT structure 210(22) of offset bump-tower 204(12) where VT structure 210(22) is in slice SLC16, or the like.

In some embodiments, block 518 aligns the corresponding via stacks of the first group to be in a central region of the array such that the first column is in the central region of the array. An example of the the via stacks of the first group being aligned so that the first column is in the central region of the array is the group of offset bump-towers 204(5)-204

(8) which are aligned to column CS17, where column CS17 is in a central region of interconnection structure 202C of FIG. 2C, or the like.

In some embodiments, block 522 forms at least some of the VT structures, and thus block 524 forms a corresponding at least some of the contact bumps, correspondingly to be in different columns on opposite sides of the first column. Examples of VT structures that are in different columns on opposite sides of the first column include VT structures 210(11)-210(14) of FIG. 2C, where VT structures 210(11)-210(12) are on a first/upper side of column CS17 and VT structures 210(13)-210(14) are on a second/lower side of column CS17.

In some embodiments, block 522 forms at least some of the VT structures, and thus block 524 forms a corresponding at least some of the contact bumps, correspondingly to be located asymmetrically with respect to the first column. Examples of VT structures that are located asymmetrically with respect to the first column include VT structures 210(11)-210(14) of FIG. 2C, where VT structures 210(11)-210(12) are in column CS15 on a first/upper side of column CS17 and VT structures 210(13)-210(14) are in column CS18 on a second/lower side of column CS17.

Figure 6:
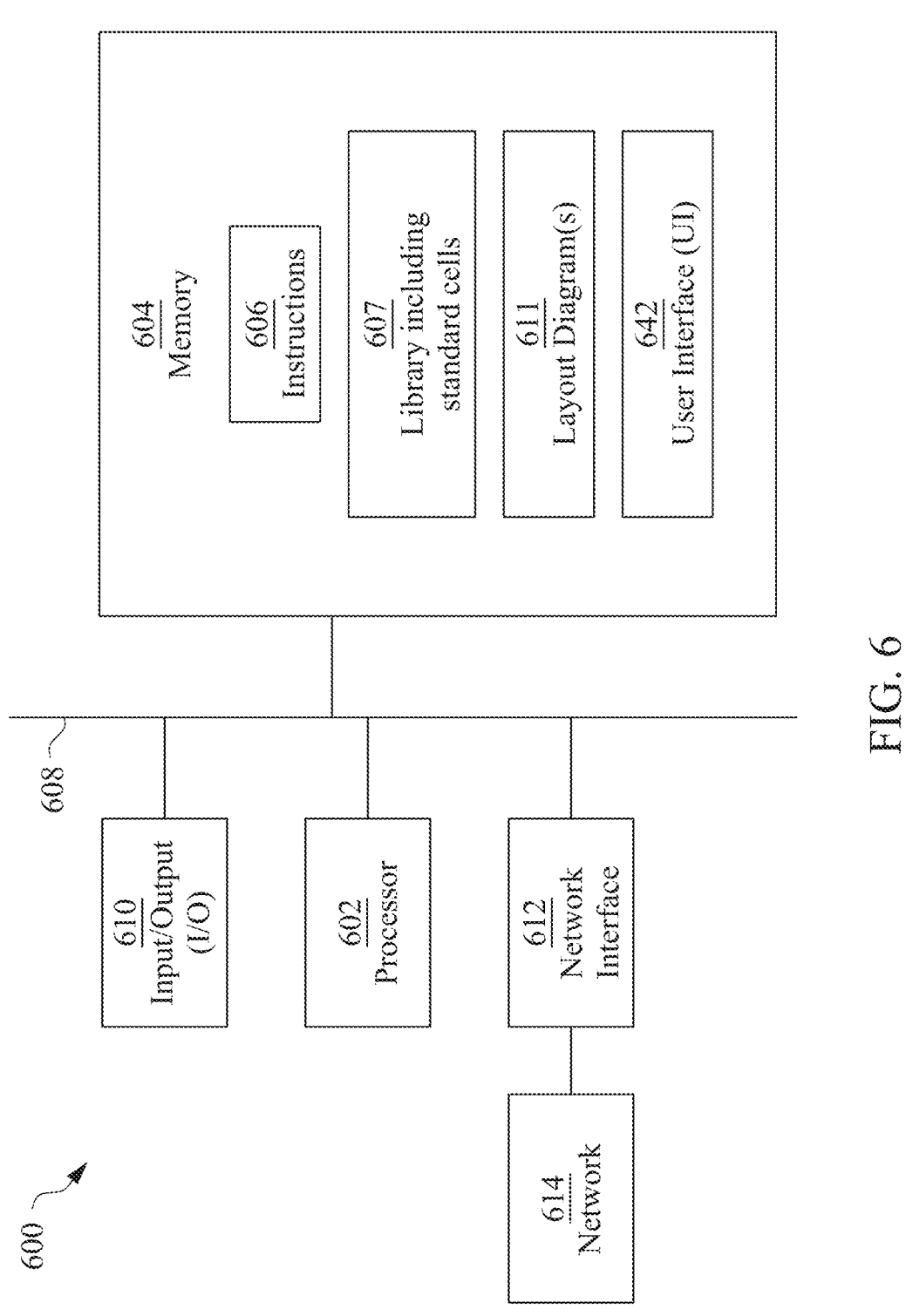
FIG. 6 is a block diagram of an electronic design automation (EDA) system in accordance with some embodiments.

FIG. 6 is a block diagram of an electronic design automation (EDA) system 600 in accordance with some embodiments.

In some embodiments, EDA system 600 includes an automatic placement and routing (APR) system. In some embodiments, EDA system 600 is a general purpose computing device including a hardware processor 602 and a non-transitory, computer-readable storage medium 604. Storage medium 604, amongst other things, is encoded with, i.e., stores, computer program code 606, i.e., a set of executable instructions. Execution of instructions 606 by hardware processor 602 represents (at least in part) an EDA tool which implements a portion or all of, e.g., methods such as the methods disclosed herein of generating layout diagrams, methods of generating layout diagrams such as the layout diagrams disclosed herein or layout diagrams corresponding to the devices disclosed herein, or the like, in accordance with one or more embodiments (hereinafter, the noted processes and/or methods).

Storage medium 604, amongst other things, stores layout diagrams 611 such as the layout diagrams disclosed herein, other the like.

Processor 602 is electrically coupled to computer-readable storage medium 604 via a bus 608. Processor 602 is further electrically coupled to an I/O interface 610 by a bus 608. A network interface 612 is further electrically connected to processor 602 via bus 608. Network interface 612 is connected to a network 614, so that processor 602 and computer-readable storage medium 604 are capable of connecting to external elements via network 614. Processor 602 is configured to execute computer program code 606 encoded in computer-readable storage medium 604 in order to cause system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program code 606 configured to cause system 600 (where such execution represents (at least in part) the EDA tool) to be usable for performing a portion or all of the noted processes and/or methods. In one or more embodiments, storage medium 604 further stores information which facilitates performing a portion or all of the noted processes and/or methods. In one or more embodiments, storage medium 604 stores library 607 of standard cells including such standard cells as disclosed herein. In some embodiments, storage medium 604 stores one or more layout diagrams 611.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 further includes network interface 612 coupled to processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 600.

System 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a user interface (UI) through I/O interface 610. The information is stored in computer-readable medium 604 as UI 642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 600. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
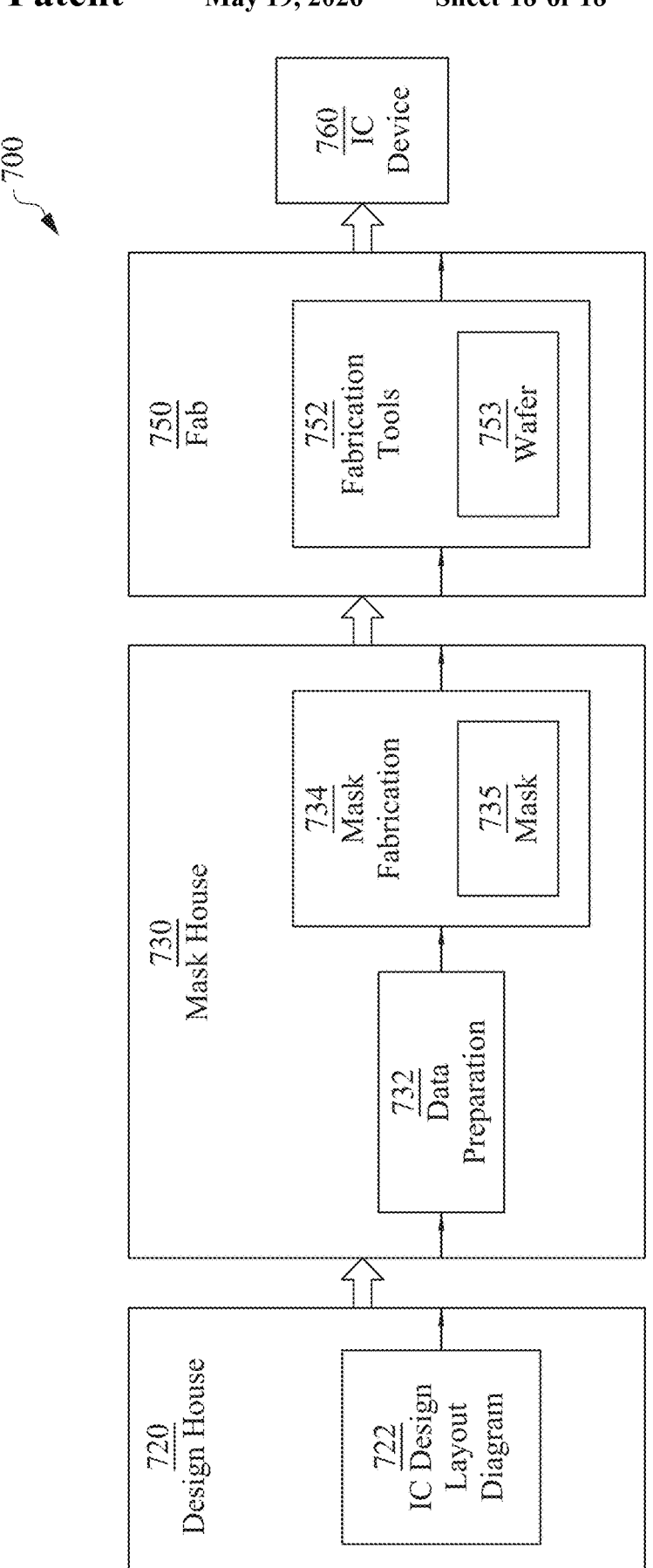
FIG. 7 is a block diagram of an integrated circuit (IC) manufacturing system, and an IC manufacturing flow associated therewith, in accordance with some embodiments.

FIG. 7 is a block diagram of an integrated circuit (IC) manufacturing system 700, and an IC manufacturing flow associated therewith, in accordance with some embodiments.

In some embodiments, based on the layout diagram generated by block 602 of FIG. 6, the IC manufacturing system 700 implements block 604 of FIG. 6 wherein at least one of (A) one or more semiconductor masks or (B) at least one component in a layer of an inchoate semiconductor integrated circuit is fabricated using manufacturing system 700. In some embodiments, the IC manufacturing system 700 implements the flowcharts of FIG. 5.

In FIG. 7, IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout 722. IC design layout 722 includes various geometrical patterns designed for an IC device 760. The geometrical patterns correspond to patterns of metal, oxide, or semiconductor layers that make up the various components of IC device 760 to be fabricated. The various layers combine to form various IC features. For example, a portion of IC design layout 722 includes various IC features, such as an active region, gate terminal, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 720 implements a proper design procedure to form IC design layout 722. The design procedure includes one or more of logic design, physical design or place and route. IC design layout 722 is presented in one or more data files having information of the geometrical patterns. For example, IC design layout 722 is expressed in a GDSII file format or DFII file format.

Mask house 730 includes data preparation 732 and mask fabrication 734. Mask house 730 uses IC design layout 722 to manufacture one or more masks 735 to be used for fabricating the various layers of IC device 760 according to IC design layout 722. Mask house 730 performs mask data preparation 732, where IC design layout 722 is translated into a representative data file ("RDF"). Mask data preparation 732 supplies the RDF to mask fabrication 734. Mask fabrication 734 includes a mask writer. A mask writer converts the RDF to an image on a substrate, such as a mask (reticle) or a semiconductor wafer. The design layout is manipulated by mask data preparation 732 to comply with particular characteristics of the mask writer and/or requirements of IC fab 750. In FIG. 7, mask data preparation 732, mask fabrication 734, and mask 735 are illustrated as separate elements. In some embodiments, mask data preparation 732 and mask fabrication 734 are collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout 722. In some embodiments, mask data preparation 732 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 734, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout 722 to fabricate a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are to be repeated to further refine IC design layout 722.

The above description of mask data preparation 732 has been simplified for the purposes of clarity. In some embodiments, mask data preparation 732 includes additional features such as a logic operation (LOP) to modify the IC design layout according to manufacturing rules. Additionally, the processes applied to IC design layout 722 during data preparation 732 may be executed in a variety of different orders.

After mask data preparation 732 and during mask fabrication 734, a mask 735 or a group of masks 735 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 734 is used in a variety of processes. For example, such a mask(s) is used in an ion implantation process to form various doped regions in the semiconductor wafer, in an etching process to form various etching regions in the semiconductor wafer, and/or in other suitable processes.

IC fab 750 is an IC fabrication business that includes one or more manufacturing facilities for the fabrication of a variety of different IC products. In some embodiments, IC fab 750 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 750 uses mask (or masks) 735 fabricated by mask house 730 to fabricate IC device 760 using fabrication tools 752. Thus, IC fab 750 at least indirectly uses IC design layout 722 to fabricate IC device 760. In some embodiments, a semiconductor wafer 753 is fabricated by IC fab 750 using mask (or masks) 735 to form IC device 760. Semiconductor wafer 753 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, an interconnection structure (for a multi-chip interposer) includes: a first via stack at a first one amongst locations, the locations correspondingly being defined relative to first and second perpendicular directions, the via stack including vias stacked over each other in a third direction perpendicular to each of the first and second directions; a transition segment in a transition layer and overlapping and coupled to an uppermost one of the vias in the via stack at the first location, the transition segment being conductive and extending in at least the first direction or the second direction to overlap a second one of locations offset from the first location; and a first contact bump at the second location and over and coupled to the via stack.

In some embodiments, the first transition segment has a convex polygon shape.

In some embodiments, the first transition segment has a concave polygon shape.

In some embodiments, the interconnection structure further includes: a transition via (VT) structure at the second location, and being between and coupling together the transition segment and the first contact bump.

In some embodiments, the vias in the first via stack are in corresponding interconnection layers, the interconnection layers including vias in addition to the uppermost via in the first via stack; the first via stack further includes conductive segments in corresponding metallization layers; and the interconnection layers and the metallization layers are interleaved.

In some embodiments, an interconnection structure (for a multi-chip interposer) includes offset bump-towers each including: a via stack at corresponding first one amongst locations, the locations correspondingly being defined relative to first and second perpendicular directions, the via stack including vias stacked over each other in a third direction perpendicular to each of the first and second directions; and a contact bump at a corresponding second one of the locations that are offset from the first location in at least the first direction or the second direction, the contact bump being coupled to the via stack.

In some embodiments, each offset bump-tower further includes: a transition segment in a transition layer and overlapping and coupled to an uppermost one of the vias in the via stack at the first location, the transition segment being conductive and extending in at least the first direction or the second direction to overlap the second location; and a transition via (VT) structure at the second location, and being between and coupling together the transition segment and the contact bump.

In some embodiments, the vias in each via stack are in corresponding interconnection layers; each via stack further includes conductive segments in corresponding metallization layers; the interconnection layers and the metallization layers are interleaved; the conductive segments in the corresponding metallization layers are aligned to corresponding rows that extend in the first direction, the rows comprising an array; the rows are stacked over each other relative to the third direction; the array is further comprised of columns; and, for a first group of at least two of the offset bump-towers, the corresponding via stacks of the first group are aligned to a first one of columns.

In some embodiments, the first column is free from including a contact bump configured for a reference voltage.

In some embodiments, the array is organized into slices; each slice extends in the second direction and the third direction; relative to the first direction, each via stack is aligned to a corresponding one of the slices; and contact bumps of adjacent offset bump-towers correspondingly are in different columns.

In some embodiments, at least some of the slices which include one or more contact bumps are slices which are free of including a via stack.

In some embodiments, relative to the second direction, the first column is in a central region of the array.

In some embodiments, relative to the second direction, the contact bumps also are correspondingly in different columns on opposite sides of the first column.

In some embodiments, relative to the second direction, the contact bumps are arranged asymmetrically with respect to the first columns.

In some embodiments, the contact bumps of the offset bump-towers are routing contact bumps; and the first column includes a power grid (PG) contact bump configured for a reference voltage.

In some embodiments, the interconnection structure further includes non-offset bump-towers each including a via stack at a corresponding third one of the locations, the via stack including vias stacked over each other in the third direction, and a PG contact bump at the third location, the PG contact bump being coupled to the via stack; and wherein: at least a first one of the non-offset bump-towers is in the first column; and the PG contact bump of the first column is included in the first non-offset bump-tower.

In some embodiments, a method (of forming an interconnection structure for a multi-chip interposer) includes: forming offset bump-towers including forming via stacks at corresponding first ones amongst locations, the locations correspondingly being defined relative to first and second perpendicular directions, each via stack including corresponding vias stacked over each other in a third direction perpendicular to each of the first and second directions; and forming contact bumps at corresponding second ones of the locations that are offset correspondingly from the first locations in at least the first direction or the second direction, the contact bumps being coupled correspondingly to the via stacks.

In some embodiments, the forming offset bump-towers further includes, before the forming the contact bumps, and for each offset bump-tower, forming a transition segment (1) in a transition layer and (2) on and overlapping and coupled to an uppermost one of the vias in the via stack at the first location, the transition segment being conductive and extending in at least the first direction or the second direction to overlap the second location, and forming a transition via (VT) structure (1) at the second location and on the transition segment; and the forming contact bumps further includes, for each offset bump-tower, forming the contact bump at the second location on the corresponding transition segment.

In some embodiments, the vias in each via stack are in corresponding interconnection layers; each via stack further includes conductive segments in corresponding metallization layers; and the forming via stacks includes alternatingly forming the interconnection layers and the metallization layers so as to form the vias in a given one of interconnection layers and then form the conductive segments in a corresponding given one of the metallization layers.

In some embodiments, the conductive segments in the corresponding metallization layers are aligned to corresponding rows that extend in the first direction, the rows comprising an array; the rows are correspondingly stacked over each other relative to the third direction; the array is further comprised of columns; and the forming via stacks includes, for a first group of at least two of the offset bump-towers, aligning the corresponding via stacks of the first group to be in a first one of columns.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An interconnection structure for a multi-chip interposer, the structure comprising:
a first via stack at a first one amongst locations, the locations correspondingly being defined relative to first and second perpendicular directions, the first via stack including vias stacked over each other in a third direction perpendicular to each of the first and second directions; and
a transition segment in a transition layer and overlapping and coupled to an uppermost one of the vias in the first via stack, the transition segment being conductive and extending in at least the first direction or the second direction to overlap a second one of locations offset from the first location; and a first contact bump at the second location and over and coupled to the first via stack.
2. The structure of claim 1, wherein:
the transition segment has a convex polygon shape.
3. The structure of claim 1, wherein:
the transition segment has a concave polygon shape.
4. The structure of claim 1, further comprising:
a transition via (VT) structure at the second location and the transition via structure being between and coupling together the transition segment and the first contact bump.
5. The structure of claim 1, wherein:
the vias in the first via stack are in corresponding interconnection layers, the interconnection layers including vias in addition to the uppermost via in the first via stack;
the first via stack further includes:
conductive segments in corresponding metallization layers; and
the interconnection layers and the metallization layers are interleaved.
6. An interconnection structure for a multi-chip interposer, the structure comprising:
offset bump-towers each including:
a via stack at a corresponding first one amongst locations, the locations correspondingly being defined relative to first and second perpendicular directions, the via stack including vias stacked over each other in a third direction perpendicular to each of the first and second directions; and
a contact bump at a corresponding second one of the locations that are offset from the first location in at least the first direction or the second direction, the contact bump being coupled to the via stack.
7. The structure of claim 6, wherein:
each offset bump-tower further includes:
a transition segment in a transition layer and overlapping and coupled to an uppermost one of the vias in the via stack at the first location, the transition segment being conductive and extending in at least the first direction or the second direction to overlap the second location; and
a transition via (VT) structure at the second location and the transition via structure being between and coupling together the transition segment and the contact bump.
8. The structure of claim 6, wherein:
the vias in each via stack are in corresponding interconnection layers;
each via stack further includes:
conductive segments in corresponding metallization layers;
the interconnection layers and the metallization layers are interleaved;
the conductive segments in the corresponding metallization layers are aligned to corresponding rows that extend in the first direction, the rows comprising an array;
the rows are stacked over each other relative to the third direction;
the array is further comprised of columns; and
for a first group of at least two of the offset bump-towers, the corresponding via stacks of the first group are aligned to a first one of columns.
9. The structure of claim 8, wherein:
the first column is free from including a contact bump configured for a reference voltage.

10. The structure of claim 8, wherein:
the array is organized into slices;
each of the slices extends in the second direction and the third direction;
relative to the first direction, each via stack is aligned to a corresponding one of the slices; and
contact bumps of adjacent offset bump-towers correspondingly are in different columns.

11. The structure of claim 10, wherein:
at least some of the slices which include one or more contact bumps are slices which are free of including a via stack.

12. The structure of claim 10, wherein:
relative to the second direction, the first column is in a central region of the array.

13. The structure of claim 12, wherein:
relative to the second direction, the contact bumps also are correspondingly in different columns on opposite sides of the first column.

14. The structure of claim 12, wherein:
relative to the second direction, the contact bumps are arranged asymmetrically with respect to the first columns.

15. The structure of claim 8, wherein:
the contact bumps of the offset bump-towers are routing contact bumps; and
the first column includes a power grid (PG) contact bump configured for a reference voltage.

16. The structure of claim 15, further comprising:
non-offset bump-towers each including:
  a via stack at a corresponding third one of the locations, the via stack including vias stacked over each other in the third direction; and
  a PG contact bump at the third location, the PG contact bump being coupled to the via stack; and
wherein:
  at least a first one of the non-offset bump-towers is in the first column; and
  the PG contact bump of the first column is included in the first non-offset bump-tower.

17. A method of forming an interconnection structure for a multi-chip interposer, the method comprising:
forming offset bump-towers including:
  forming via stacks at corresponding first ones amongst locations, the locations correspondingly being defined relative to first and second perpendicular directions, each via stack including corresponding vias stacked over each other in a third direction perpendicular to each of the first and second directions; and
  forming contact bumps at corresponding second ones of the locations that are offset correspondingly from the first locations in at least the first direction or the second direction, the contact bumps being coupled correspondingly to the via stacks.

18. The method of claim 17, wherein:
the forming offset bump-towers further includes:
  before the forming the contact bumps, and
    for each offset bump-tower,
      forming a transition segment (1) in a transition layer and (2) on and overlapping and coupled to an uppermost one of the vias in the via stack at the first location, the transition segment being conductive and extending in at least the first direction or the second direction to overlap the second location; and
      forming a transition via structure at the second location and on the transition segment; and
the forming contact bumps further includes:
  for each offset bump-tower,
    forming the contact bump at the second location on the corresponding transition segment.

19. The method of claim 17, wherein:
the vias in each via stack are in corresponding interconnection layers;
each via stack further includes conductive segments in corresponding metallization layers; and
the forming via stacks includes:
  alternatingly forming the interconnection layers and the metallization layers so as to form the vias in a given one of interconnection layers and then form the conductive segments in a corresponding given one of the metallization layers.

20. The method of claim 19, wherein:
the conductive segments in the corresponding metallization layers are aligned to corresponding rows that extend in the first direction, the rows comprising an array;
the rows are correspondingly stacked over each other relative to the third direction;
the array is further comprised of columns; and
the forming via stacks includes:
  for a first group of at least two of the offset bump-towers, aligning the corresponding via stacks of the first group to be in a first one of columns.

* * * * *